United States Patent
Van Buskirk

(10) Patent No.: US 8,912,517 B2
(45) Date of Patent: Dec. 16, 2014

(54) RESISTIVE SWITCHING MEMORY

(71) Applicant: Adesto Technologies Corporation, Sunnyvale, CA (US)

(72) Inventor: Michael A. Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/625,518

(22) Filed: Sep. 24, 2012

(65) Prior Publication Data

US 2014/0084232 A1 Mar. 27, 2014

(51) Int. Cl.
*H01L 29/02* (2006.01)

(52) U.S. Cl.
USPC ............. 257/2; 257/3; 257/4; 257/5; 365/46; 365/148

(58) Field of Classification Search
USPC ................. 257/2–5; 365/46, 48, 158
See application file for complete search history.

(56) References Cited

U.S. PATENT DOCUMENTS

| | | | |
|---|---|---|---|
| 4,751,677 A | 6/1988 | Daughton et al. | |
| 5,029,131 A | 7/1991 | Vancu | |
| 5,291,045 A | 3/1994 | Atsumi | |
| 5,430,670 A | 7/1995 | Rosenthal | |
| 5,754,477 A | 5/1998 | Forbes | |
| 6,141,256 A | 10/2000 | Forbes | |
| 6,256,247 B1 | 7/2001 | Perner | |
| 6,545,904 B2 | 4/2003 | Tran | |
| 6,639,818 B1 | 10/2003 | Nojima | |
| 6,765,825 B1 | 7/2004 | Scott | |
| 6,861,707 B1 | 3/2005 | King | |
| 7,050,316 B1 | 5/2006 | Lin et al. | |
| 7,349,232 B2 | 3/2008 | Wang et al. | |
| 8,064,248 B2 | 11/2011 | Lung | |
| 2006/0245227 A1* | 11/2006 | Nazarian | 365/46 |
| 2010/0176362 A1* | 7/2010 | Lung et al. | 257/2 |
| 2011/0102063 A1* | 5/2011 | Zeller | 327/520 |
| 2013/0234102 A1* | 9/2013 | Ottogalli et al. | 257/5 |

OTHER PUBLICATIONS

Oishi, Motoyuki, "DRAM Makers Cut Cost by 30% a Year to 2011," Nikkei Electronics Asia, Tech & Industry Analysis from Asia, Tech-On!, Jan. 2008, Nikkei Business Publications, Inc., retrieved Jul. 22, 2012, 3 pages, <techon.nikkeibp.co.jp/article/HONSHI/20071219/144399/>.

Cheung, Peter, "Topic 12 Memory Circuits," Reading: Weste Ch. 8.3.1-8.3.2, Rabaey Ch. 10, p. 551-595, Department of Electrical & Electronic Engineering Imperial College London, Topics 12-1—Topic 12-62, E4.20 Digital I C Design, Nov. 23, 2009, Prentice Hall 2000, 16 pages.

* cited by examiner

*Primary Examiner* — Earl Taylor
*Assistant Examiner* — Frederick B Hargrove
(74) *Attorney, Agent, or Firm* — Slater & Matsil, L.L.P.

(57) ABSTRACT

In one embodiment of the present invention, a memory cell includes a first resistive switching element having a first terminal and a second terminal, and a second resistive switching element having a first terminal and a second terminal. The memory further includes a three terminal transistor, which has a first terminal, a second terminal, and a third terminal. The first terminal of the three terminal transistor is coupled to the first terminal of the first resistive switching element. The second terminal of the three terminal transistor is coupled to the first terminal of the second resistive switching element. The third terminal of the three terminal transistor is coupled to a word line.

27 Claims, 21 Drawing Sheets

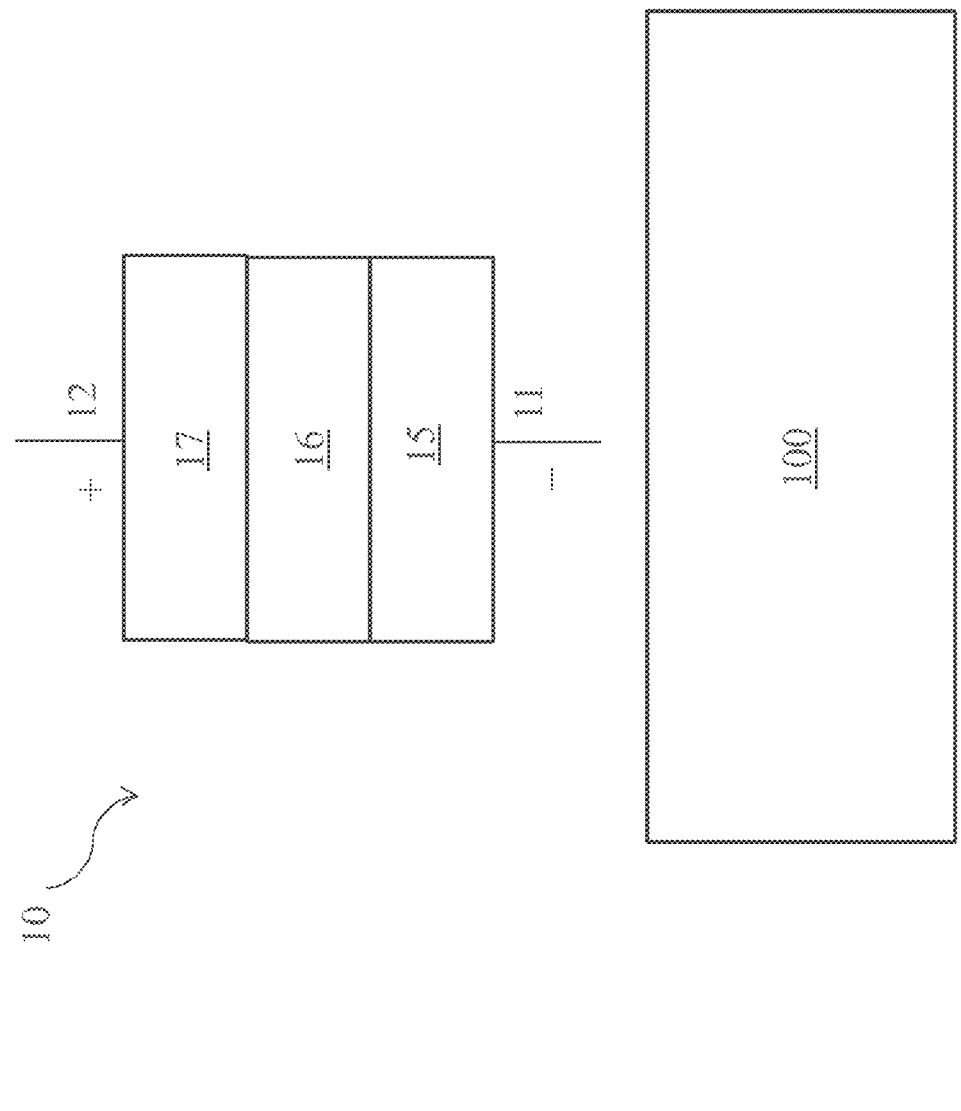

| STATE | R1 (10) | | R2 (20) | |
|---|---|---|---|---|
| | LO=10 | HI=100 | HI=100 | LO=10 |
| I | | | | |
| II | | | | |

*FIG. 3D*

RESISTIVE SWITCHING MEMORY

TECHNICAL FIELD

The present invention relates generally to memory devices, and more particularly to resistive switching memory.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), metal oxide based memories, and programmable metallization cell (PMC) or ionic memories. These memories are also called as emerging memories.

To be viable, the emerging memory has to be better than Flash memory in more than one of technology metrics such as scalability, performance, energy efficiency, On/Off ratio, operational temperature, CMOS compatibility, and reliability.

One of the challenges of memory design relates to cell margin. For example, the switching element, which switches between a first state and a second state has to maintain a sufficient difference between the two states so that a subsequent read operation may distinguish between them. If the difference between the two states becomes smaller than the sensitivity of the reading process, then the memory cell may lose the stored data.

SUMMARY OF THE INVENTION

In accordance with an embodiment of the present invention, a memory cell comprises a first resistive switching element having a first terminal and a second terminal, a second resistive switching element having a first terminal and a second terminal, and a three terminal transistor. The three terminal transistor has a first terminal, a second terminal, and a third terminal. The first terminal of the three terminal transistor is coupled to the first terminal of the first resistive switching element. The second terminal of the three terminal transistor is coupled to the first terminal of the second resistive switching element. The third terminal of the three terminal transistor is coupled to a word line.

In accordance with an alternative embodiment of the present invention, a memory cell comprises a first resistive switching element having a cathode terminal and an anode terminal, and a second resistive switching element having a cathode terminal and an anode terminal. The memory cell further comprises a bipolar transistor having a first emitter/collector, a second emitter/collector, and a base. The first emitter/collector is coupled to the cathode terminal of the first resistive switching element. The second emitter/collector is coupled to the cathode terminal of the second resistive switching element. The base is coupled to a word line. The anode terminal of the first resistive switching element is coupled to a first bit line of a bit line pair. The anode terminal of the second resistive switching element is coupled to a second bit line of the bit line pair. The memory cell is configured to store a first or a second memory state.

In accordance with an alternative embodiment of the present invention, a memory cell comprises a first resistive switching element having a first terminal and a second terminal, and a second resistive switching element having a first terminal and a second terminal. The memory cell further comprises a transistor having a first source/drain and a second source/drain. The first source/drain is coupled to the first terminal of the first resistive switching element, and the second source/drain is coupled to the first terminal of the second resistive switching element.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2A-2D, illustrates a structural implementation of a differential memory cell array in accordance with an embodiment of the present invention, wherein FIG. 2A illustrates a top view while FIGS. 2B and 2C illustrate cross-sectional views and FIG. 2D illustrates a magnified view of a resistive switching element in one embodiment;

FIG. 3, which includes FIGS. 3A-3E, illustrates the operation of the memory cell array in accordance with embodiments of the present invention, wherein FIG. 3A illustrates activating a memory cell, wherein FIG. 3B illustrates a memory cell of the memory cell array during a write operation in accordance with an embodiment of the present invention, wherein FIG. 3C illustrates the operation of the memory cell including parasitic effects in accordance with an embodiment of the present invention, wherein FIG. 3D illustrates the operational states of the memory cell in accordance with embodiments of the present invention, and wherein FIG. 3E illustrates a memory cell of the memory cell array during a read operation in accordance with an embodiment of the present invention;

FIG. 4, which includes FIGS. 4A-4E, illustrates a memory cell array in accordance with an alternative embodiment of the present invention, wherein FIGS. 4B-4E illustrate a structural implementation of the memory cell illustrated in FIG. 4A in accordance with embodiments of the present invention, wherein FIG. 4B illustrates a top view, wherein FIGS. 4C and 4D illustrate cross-sectional views while FIG. 4E illustrates a magnified cross-sectional view of the resistive switching element;

FIG. 7, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of contexts. The embodiments discussed are merely illustrative of a few ways to make and use the invention, and do not limit the scope of the invention.

The present invention will be described with respect to various embodiments in a specific context, namely ionic memories such as programmable metallization cells (also called as conductive bridging memories, nanobridge memories, or electrolytic memories). The invention may also be applied, however, to other types of memories, particularly, to any resistive memory such as two terminal resistive memories.

Embodiments of the present invention describe a 1T-2R (one transistor-two resistors) differential memory cell. As a consequence, embodiments of the invention improve cell margin without significantly increasing cell size. For example, the resistance states of the two resistors of the memory cell may drift significantly (at least more than what is allowed for a 1T-1R memory cell) without losing data. Advantageously, in the memory cell design described below in various embodiments, both resistive elements may have to completely lose data for the memory cell to fail data retention.

In various embodiments, advantageously, both the resistive memory elements of the 1T-2R memory cell may be switched simultaneously in a single program/erase operation. In other words, in various embodiments described below, writing data to one side of cell automatically writes opposite data to other side of cell. This avoids a significant increase in switching time relative to a 1T-1R memory cell.

Embodiments of the invention describe a single transistor differential memory cell, for example, using a single lateral bipolar junction transistor access device or a field effect transistor access device in some embodiments. As a consequence, the cell size may be reduced compared to a conventional two transistor differential memory cell design with two transistors. For example, a memory cell having $8F^2$ cell area may be possible using a lateral bipolar transistor described in FIGS. 1-4, where F is the technology feature size (pattern line and/or space), e.g., F may be 50 nm. Alternatively, a cell size less than about $12F^2$ may be formed using field effect transistors as described in FIGS. 5-6.

Figure 1:
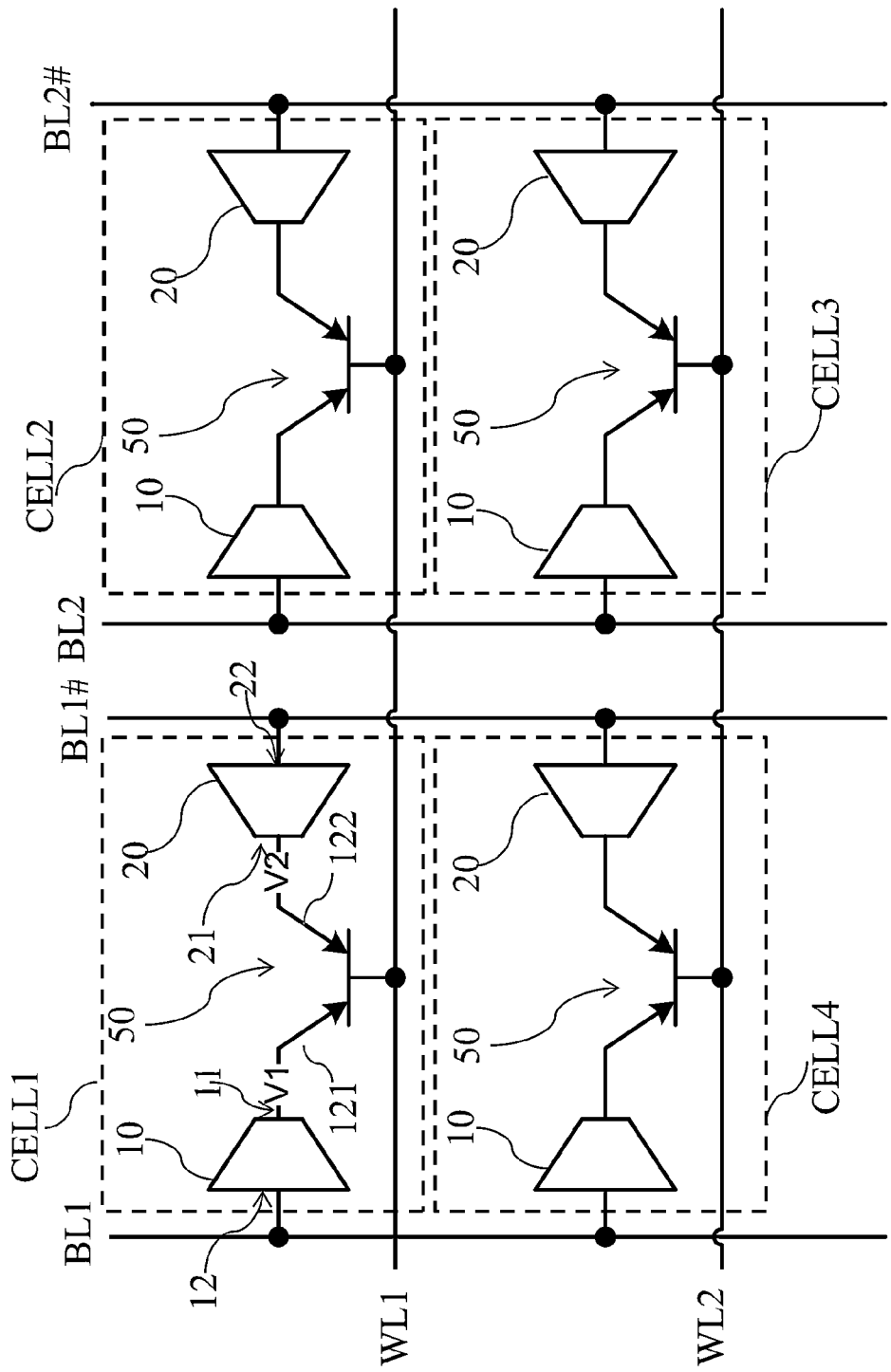
FIG. 1 illustrates a schematic circuit of a differential memory cell array in accordance with an embodiment of the present invention.

FIG. 1 illustrates a schematic circuit of a differential memory cell array in accordance with an embodiment of the present invention.

Referring to FIG. 1, a memory cell array comprises an array of memory cells, for example, a first memory cell (CELL1), a second memory cell (CELL2), a third memory cell (CELL3), and a fourth memory cell (CELL4). Each of the memory cells in the memory array may be a one transistor-two resistors (1T-2R) memory cell in one or more embodiments.

The memory cell array may be programmed, erased, read using a plurality of voltage rails. The memory cell array may be connected through a plurality of word lines WL, a plurality of bit lines BL. Each cell is operated using a pair of bit lines, for example, a first bit line pair BL1 and BL1# for the first memory cell and the fourth memory cell, the second bit line pair BL2 and BL2# for the second memory cell and the third memory cell. The memory array includes plurality of word lines, for example, a first word line WL1 serving the first memory cell and the second memory cell, and the second word line WL2 serving the third memory cell and the fourth memory cell.

Each memory cell comprises a first resistive switching element 10, a second resistive switching element 20, and a bipolar transistor 50. The first resistive switching element 10 has a cathode 11 and an anode 12. Similarly, the second resistive switching element 20 has a cathode 21 and an anode 22. In one or more embodiments, the first resistive switching element 10 and the second resistive switching element 20 comprise the same type of switching element. In one or more embodiments, the first resistive switching element 10 and the second resistive switching element 20 have similar characteristics, e.g., similar resistive states in OFF and ON states, and similar threshold voltages. Alternatively, the first resistive switching element 10 and the second resistive switching element 20 may be asymmetric, e.g., the first resistive switching element 10 may have a lower off state resistance than the second resistive switching element 20 or the first resistive switching element 10 may have a lower switching threshold than the second resistive switching element 20. Switching threshold is voltage at which the resistive switching element changes resistance from either the high resistive state to the low resistive state (program threshold, Vtp) or from the low resistance state to the high resistance state (erase threshold Vte). The program and erase thresholds are not necessarily the same and may be a function of the time the programming or erasing voltage is applied.

In various embodiments, the first and the second resistive switching memory elements 10 and 20 may comprise resistive switching memories that switch based on thermal, electrical, and/or electromagnetic effects. The first resistive switching element 10 and the second resistive switching element 20 are configured to be programmed (high to low resistance state) by the application of a positive voltage at the anode relative to the cathode and erased (low to high resistance state) by the application of a negative voltage at the anode relative to the cathode.

As illustrated, the anode 12 of the first resistive switching element 10 is coupled to one of the first bit line pair BL1 while the anode 22 of the second resistive switching element 20 is coupled to the other of the first bit line pair BL1#. The cathode 11 of the first resistive switching element 10 is coupled to a first emitter/collector region 121 of the bipolar transistor 50. Similarly, the cathode 21 of the second resistive switching element 20 is coupled to a second emitter/collector region 122 of the bipolar transistor 50. The base of the bipolar transistor 50 is coupled to a word line, for example the base of the bipolar transistor 50 of the first memory cell is coupled to the first word line WL1.

Thus, as will be described further in FIG. 3, the memory cell is a differential cell using a difference in the resistance between the first resistive switching element 10 and the second resistive switching element 20 to store a memory state. For example, a first memory state of the differential memory cell may correspond to a low resistance state at the first resistive switching element 10 and a high resistance state at the second resistive switching element 20. A second memory state of the differential memory cell may correspond to a high resistance state at the first resistive switching element 10 and a low resistance state at the second resistive switching element 20.

Figure 2A:
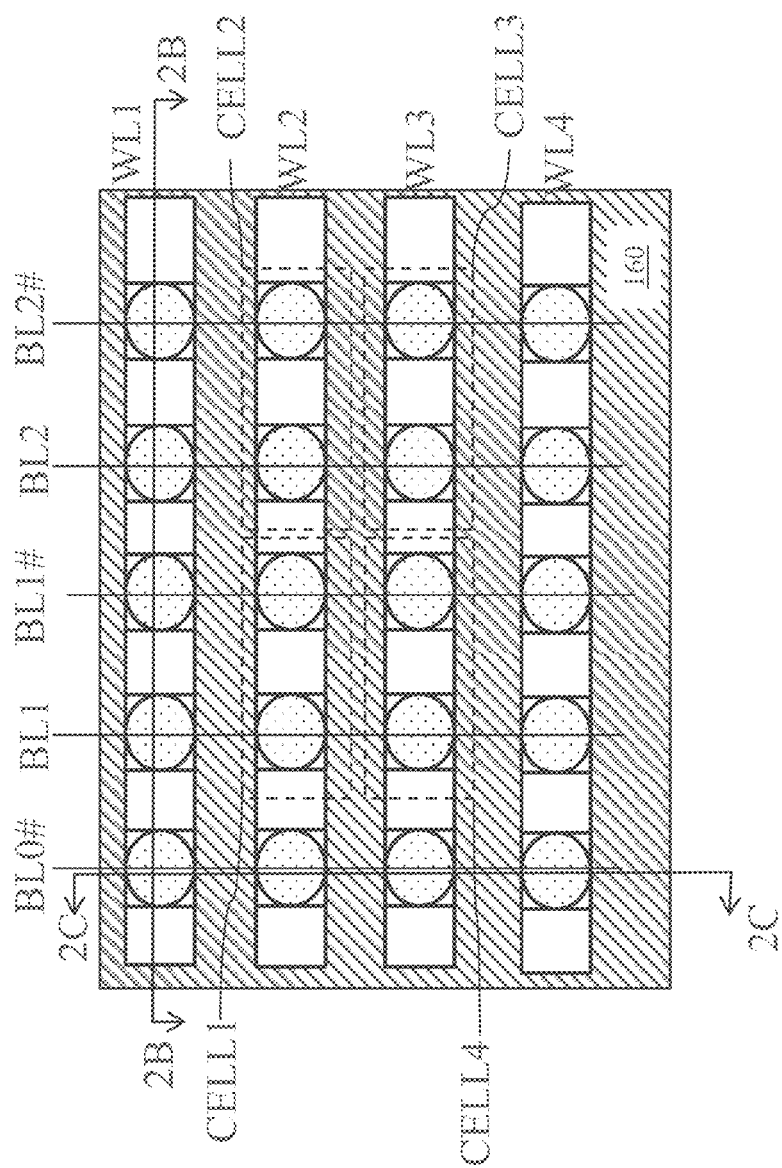
Figure 2B:
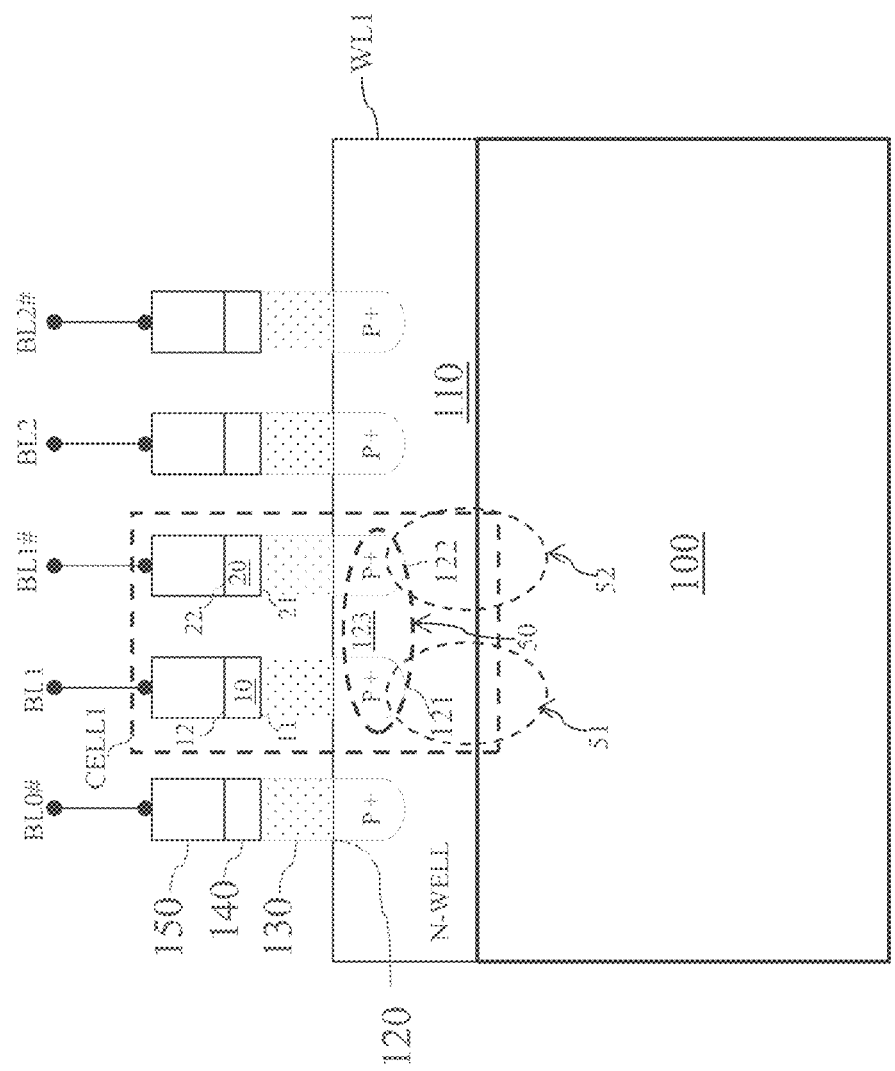
Figure 2C:
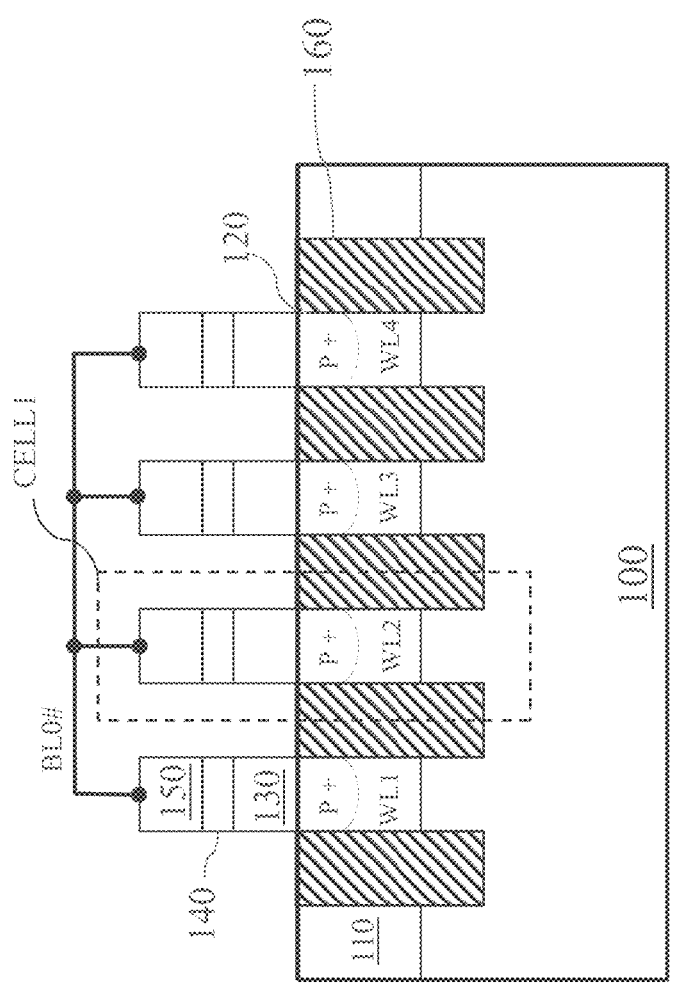

FIG. 2, which includes FIGS. 2A-2D, illustrates a structural implementation of a differential memory cell array in accordance with an embodiment of the present invention. FIG. 2A illustrates a top view while FIGS. 2B and 2C illustrate cross-sectional views and FIG. 2D illustrates a magnified view of a resistive switching element in one embodiment. FIG. 2 may be an implementation of the memory cell circuit illustrated in FIG. 1.

Referring to FIG. 2A, a plurality of word lines, e.g., a first word line WL1, a second word line WL2, a third word line WL3, and a fourth word line WL4 are disposed within and/or over a substrate 100. In various embodiments, the plurality of word lines may be doped semiconductor embedded within and/or the substrate 100 (FIG. 2C). The plurality of word lines may be isolated from each other by isolation regions, for example, trench isolation 160.

As illustrated in the top of view of FIG. 2A, a plurality of bit lines are formed over the substrate 100. Referring to FIG. 2B, a well region 110 is formed over a substrate 100. The well region 110 may have a first doping type (n-type or p-type), which is opposite to the doping type of the substrate 100 (noting that FIG. 2 illustrates a case in which the first doping type is n-type). Therefore, the well region 110 may perform the function of the plurality of word lines. Thus, the plurality of word lines is formed as a buried diffusion region in the substrate 100. As illustrated in FIG. 2C, the trench isolation 26 is deeper than the depth of the well region 110 and therefore forms a plurality of word lines (WL1, WL2, WL3, WL4, and so on).

A plurality of doped regions 120 is formed on a top surface of the well region 110. The plurality of doped regions 120 has the second doping type, which is the reverse of the doping of the well region 110. Consequently, a bipolar transistor 50 (FIG. 1, 2B) is formed between the plurality of doped regions 120 and the well region 110. As illustrated in FIG. 2B, a first emitter/collector region 121 of the plurality of doped regions 120, a base region 123 of the well region 110, and a second emitter/collector region 122 form a lateral bipolar transistor 50. In various embodiments, illustrated in FIG. 2, the first doping type is n-type and the second doping type is p-type. The base region 123 of the bipolar transistor is part of the well region 110, and therefore the base of the bipolar transistor 50 is directly electrically coupled to the word line forming the well region 110.

Additionally, parasitic transistors are formed with this structure. For example, the first emitter/collector region 121, a portion of the well region 110, and the substrate 100 form a first parasitic bipolar transistor 51 while the second emitter/collector region 122, another portion of the well region 110, and the substrate 100 form a second parasitic bipolar transistor 52.

The plurality of doped regions 120, which includes the first emitter/collector region 121 and the second emitter/collector region 122, are coupled through a plurality of contacts 130. The plurality of resistive switching elements 140 within the metallization layers is disposed over the plurality of contacts 130. The plurality of resistive switching elements 140 may be disposed in any metallization levels over the substrate 100. The plurality of resistive switching elements 140 may be formed over one or more metallization levels in various embodiments.

In one or more embodiments, each of the plurality of resistive switching elements 140 may comprise an ionic memory. Such ionic memory may involve cells based on anion migration or cation migration. An example of an ionic memory includes a conductive bridging random access memory. The CBRAM may comprise a solid electrolyte layer sandwiched between an inert electrode and an electro-chemically active electrode. In other embodiments, each of the plurality of resistive switching elements 140 may comprise metal oxide memory, which switches based on electronic effects, e.g., based on resistive switching metal oxides. In an alternate embodiment, each of the plurality of resistive switching elements 140 may switch based on thermal effects and may comprise a phase change memory unit in alternative embodiments.

In various embodiments, as will be described using FIG. 3, each of the plurality of resistive switching elements 140 may comprise any type of memory, which requires lower erase currents than programming currents.

The plurality of resistive switching elements 140 includes a first resistive switching element 10 and a second resistive switching element 20 (as also illustrated in FIG. 1). For ease of understanding, the anode 12 of the first resistive switching element 10 and the cathode 11 of the first resistive switching element 10, and the anode 22 of the second resistive switching element 10 and the cathode 21 of the second resistive switching element 20 are also illustrated in FIG. 2B.

Referring to FIG. 2B, the plurality of bit line contacts 150 is disposed over the plurality of resistive switching elements 140. The plurality of bit line contacts 150 may couple to the bit lines disposed over the plurality of resistive switching elements 140. In one or more embodiments, the plurality of bit line contacts 150 may comprise vias contacting the top electrode layer of the resistive switching element 140 and a metal line forming a bit line.

FIG. 2D illustrates a magnified view of a resistive switching element in accordance with an embodiment of the present invention.

In one embodiment, each of the plurality of resistive switching elements 140 (e.g., a first resistive switching element 10) comprises an electrolytic memory. In various embodiments, each of the plurality of resistive switching elements 140 such as the first resistive switching element 10 may comprises a cathode electrode layer 15, a switching layer 16, and an anode electrode layer 17. The cathode electrode layer 15 may be an inert or active (participating in the switching mechanism) electrode, which forms the cathode 11, and may be coupled to the plurality of contacts 130 (see FIG. 2B). The cathode electrode layer 15 may be formed as a bottom electrode of the resistive switching element in various embodiments.

In one or more embodiments, the switching layer 16 may comprise a layer that is capable of changing conduction from relatively low conductance to relatively high conductance. In various embodiments, the layer (switching layer 16) may comprise a chalcogenide material such as a germanium based chalcogenide, e.g., a copper doped $GeS_2$ layer. In an alternative embodiment, the layer may comprise silver doped $GeS_2$. In other embodiments, the layer may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, the layer may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof.

In one embodiment, the switching layer 16 may comprise transition metal oxides which may change conductivity due to the formation of charged point defects such as oxygen vacancies, other charge complexes, or other mechanisms so as to increase or decrease conductivity in the layer. The switching layer 16 may comprise metal oxides such as hafnium oxide, gadolinium oxide, and other such materials doped with copper, silver, Te or other transition metals in various embodiments. In other examples, a metal oxide based switching layer 16 may comprise $NiO_x$, $TiO_x$, $Al_2O_3$, $Ta_2O_5$, $CuO_x$, $WO_x$, $CoO$, $Gd_2O_3$, $TiO_x$, $FeO_x$, chromium doped perovskite oxides such as $SrZrO_3$, $(Ba, Sr)TiO_3$, $SrTiO_3$, copper doped $MoO_x$, copper doped $Al_2O_3$, copper doped $ZrO_2$, Al doped ZnO, $Pr_{0.7}Ca_{0.3}MnO_3$, as examples.

The anode electrode layer 17, which forms the anode 12, may comprise an electrochemically active metal such as silver, copper, zinc, Ti, Ta, alloys or layered structures of Cu and Te, alloys or layered structures of Ti and Te, alloys or layered structures of Ta and Te, and others in various embodiments. The anode electrode layer 17 may also have a cap layer such as titanium nitride or tantalum nitride (as well as other suitable materials) in various embodiments.

FIG. 3, which includes FIGS. 3A-3E, illustrates the operation of the memory cell array in accordance with embodiments of the present invention.

In various embodiments, as also illustrated in FIG. 2, a lateral bipolar transistor is used to implement blocking diodes and as an access device for the memory cell. Advantageously, such an implementation simplifies the interconnect structure for the memory cell array. As described in the above embodiment, the base of the bipolar transistor is directly electrically coupled to the word line, which is formed as a buried diffusion region.

In accordance with an embodiment of the present invention, the first memory cell may be activated by applying a positive write voltage $-V_{WRITE}$ at the first bit line BL1 and a negative write voltage $-V_{WRITE}$ at the other first bit line BL1#. The first word line WL1 is pulled up to one intermediate voltage, for example, to 0V. The second memory cell and the third memory cell are inhibited because of the absence of potential difference between the bit line pairs. The second word line WL2 (as well as the remaining word lines in the array) may be pulled to high (positive write voltage $+V_{WRITE}$) to turn off the corresponding bipolar transistor. Thus, the fourth memory cell is also inhibited by applying a positive voltage on the base of the bipolar transistor to turn off the bipolar transistor.

Figure 3A:
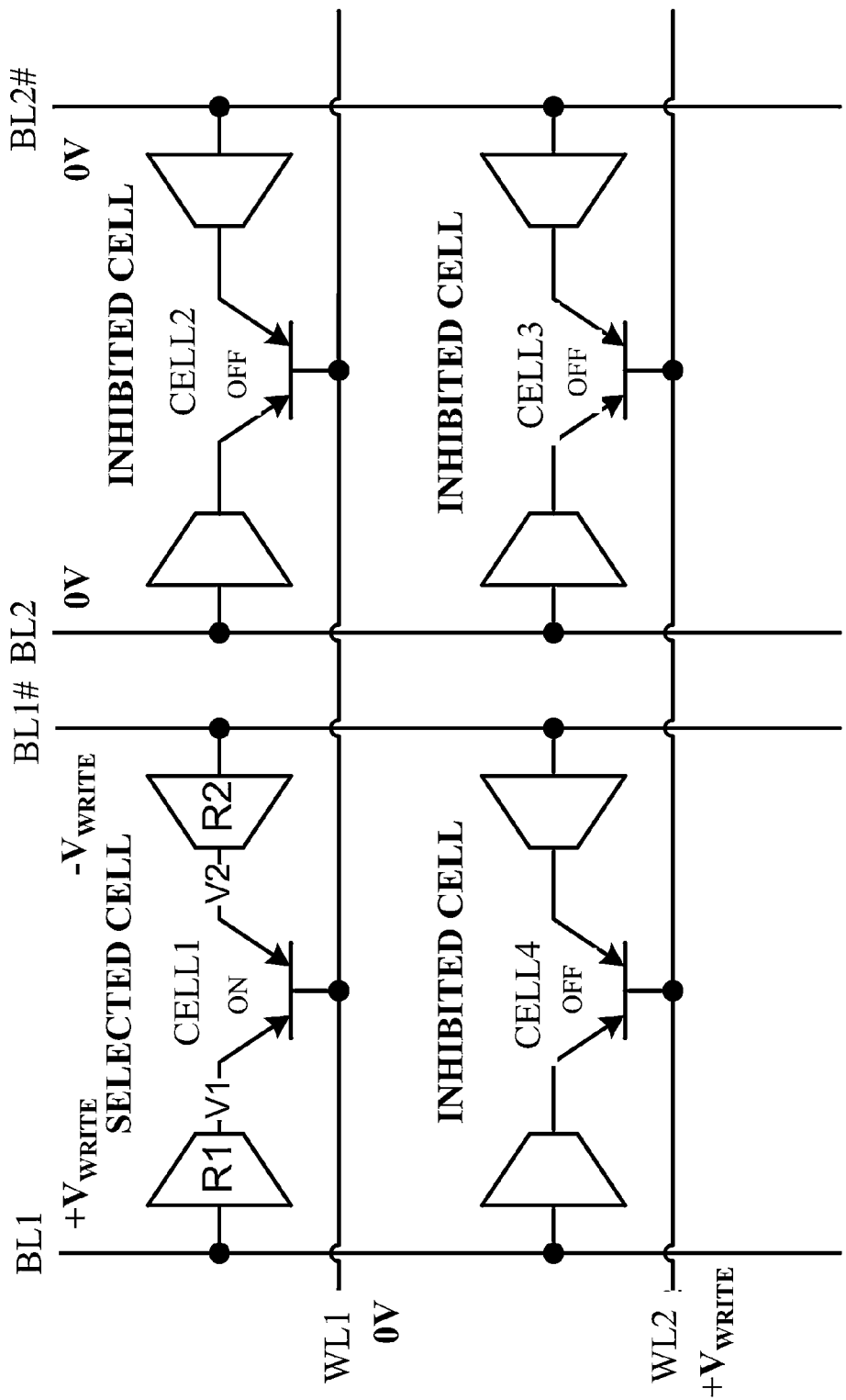
Figure 3B:
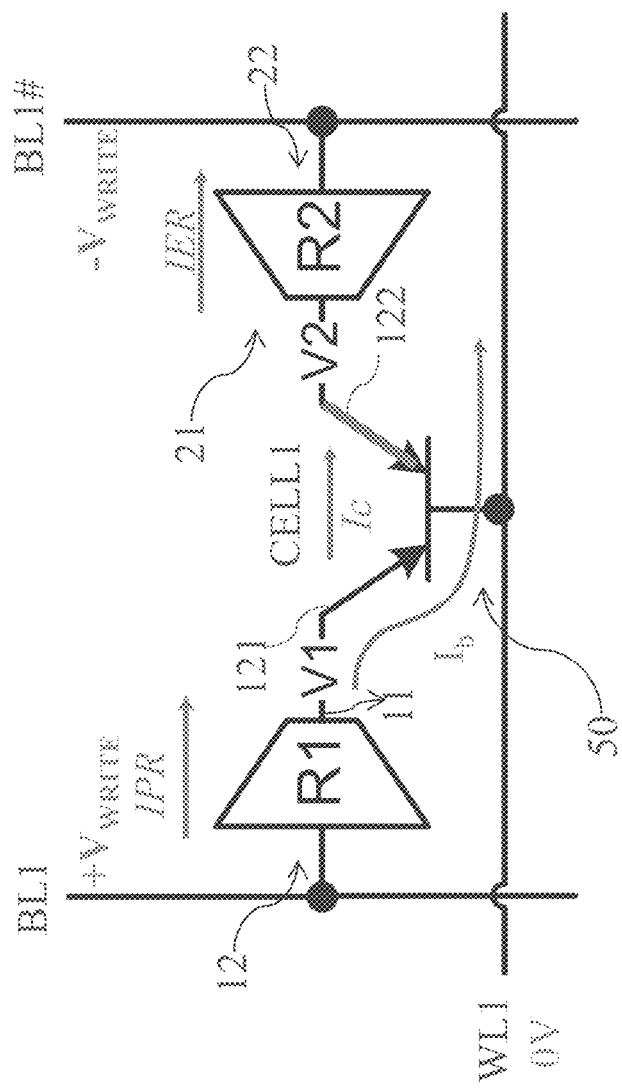

FIG. 3B illustrates a memory cell of the memory cell array during a write operation in accordance with an embodiment of the present invention. The illustration uses an example for programming R1 and erasing R2. It will be understood by those with ordinary skill in the art that reversing the respective BL voltages will erase R1 and program R2.

As described above, during a write operation, a positive write voltage $+V_{WRITE}$ is applied at the first bit line BL1 and a negative write voltage $-V_{WRITE}$ (−Vwrite may have different absolute magnitude than +Vwrite) is applied at the other first bit line BL1#, and an intermediate voltage (0V) is applied at the first word line WL1. As a consequence, a program current IPR flows through the first resistive switching element 10 and an erase current IER flows through the second resistive switching element 20. Thus, while the first resistive switching element 10 transitions from a high resistance state to a low resistance state, simultaneously, the second resistive switching element 20 transitions from a low resistance state to a high resistance state.

Before the switching of the states of the first and the second resistive switching elements 10 and 20, the bit line voltages are asserted. The first emitter/collector region 121 of the bipolar transistor 50 is initially at about 0V and the base current ($I_b$) is negligible (leakage current). The write voltage of the bit line may be coupled through a high resistance state R1 of the first resistive switching element 10. Thus, the voltage at the anode 12 of the first resistive switching element 10 (Vbl) increases after the application of the bit line voltage.

For better understanding of the operation of the memory cell, the current flowing through each of the device is described below. However, these equations include many assumptions regarding the operation and device physics. As is known to one skilled in the art, more accurate results may be obtained by detailed modeling combined with experimental data and/or direct experimental measurements. Therefore, the following equations are provided for intuitive understanding.

During programming of the first resistive switching element 10, the voltage at the anode 12 is given as $$Vbl = \left(\frac{R1}{R1+Rl}\right) * (+Vwrite - Vbe) + Vbe.$$

Vbe is the potential at the first emitter collector region 121 and is about the same as the potential V1 at the cathode 11 of the first resistive switching element 10. Rl is the series resistance between +Vwrite and Vbl resulting from both the program/erase control circuits and memory array access circuits. Rl may be a small number with respect to R1.

The emitter current Ie through the first emitter/collector region 121, which is the same as the program voltage IPR, may be written as $$Ie = \frac{Vwrite - Vbe}{R1+Rl} = Ipr.$$

Thus the collector current Ic may be determined as $$Ic = \left(\frac{\beta}{\beta+1}\right) * \left(\frac{Vwrite - Vbe}{R1+Rl}\right).$$

Here, $\beta$ is the common emitter current gain given by the ratio of the collector current Ic to the base current Ib. Thus, a portion of the emitter current Ie flows into the first word line WL1 as base current Ib, and a remaining portion Ic flows into the second resistive switching element 20.

Thus, immediately after (during) programming the first resistive switching element 10 the second resistive switching element 20 is erased due to the flow of the collector current Ic. However, less current flows during the erase process of the second resistive switching element 20 than in the program process of the first resistive switching element 10.

However, advantageously, many memory systems based on metal oxide memories and programmable metallization cell memories such as CBRAM require less erase current than program current. Therefore, embodiments of the invention may be applied to such memories.

The maximum erase current in the second resistive switching element 20, which is the collector current of the bipolar transistor 50 may be determined as $$\frac{V2 + Vwrite}{R2} = Ic = \text{Max.Erase Current}$$

Here, R2 is the low resistance state of the second resistive switching element 20. The maximum erase voltage V2max at the cathode 21 of the second resistive switching element 20 is given as $$V2\text{max} = Vbe - Vce \approx 0.4V.$$

The maximum erase current during the erase operation is thus given by $$\text{Max. Erase Current} = Ipr * \frac{\beta}{\beta+1}.$$

Figure 3C:
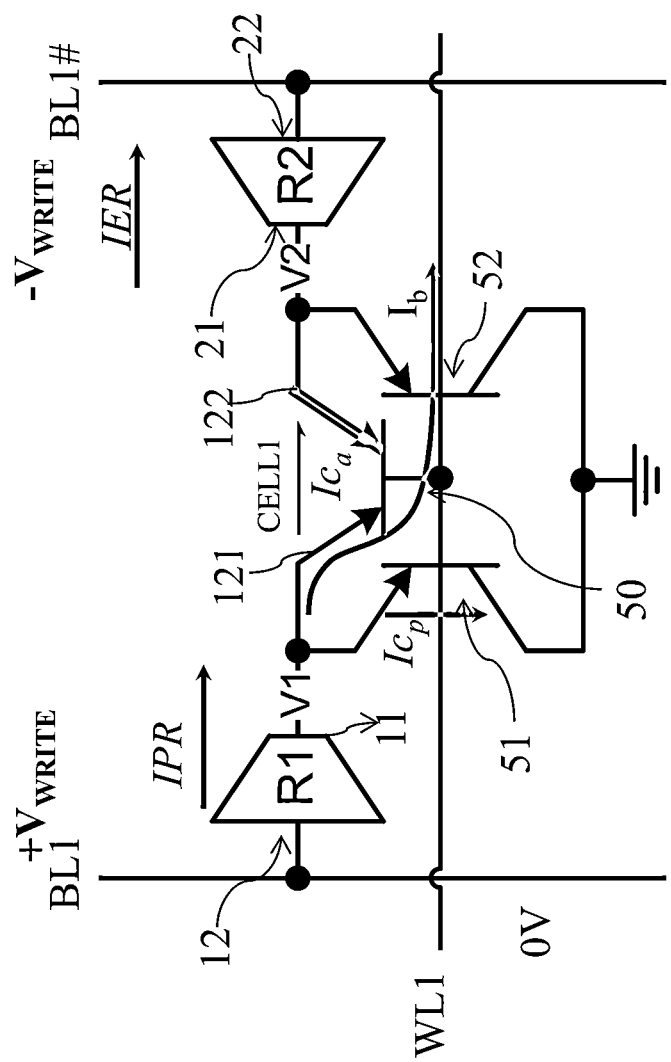

FIG. 3C illustrates the operation of the memory cell including parasitic effects in accordance with an embodiment of the present invention.

As described above with respect to FIG. 2, parasitic vertical bipolar transistors, for example, a first parasitic transistor 51 and a second parasitic transistor 52 (FIG. 2B) are also formed along with the lateral bipolar transistor 50. However, the programming, erase, and read operations of the differential resistive memory cell are similar to that described in FIG. 3B.

Similar to FIG. 3B, the first emitter/collector region 121 of the bipolar transistor 50 is initially at about 0V and the base current ($I_b$) is negligible (leakage current). The write voltage of the bit line may be coupled through a high resistance state R1. Thus, the voltage at the anode 12 of the first resistive switching element 10 (Vbl) increases after the application of the bit line voltage. At the beginning of the programing operation, the collector current $Ic_a$ through the bipolar transistor 50 and the collector current $Ic_p$ through the first parasitic transistor 51 are negligible. The voltage potential at the cathode 21 of the second resistive element 20 is pulled down to about negative write voltage $-V_{WRITE}$ on the application of the negative write voltage on the other first bit line BL1#. Further, the second parasitic transistor 52 is in an OFF state because the parasitic diode between the second emitter/collector region 122 and the base of the second parasitic transistor 52 is under reverse bias.

During programming of the first resistive switching element 10, the voltage of the anode 12 is given as $$Vbl = \left(\frac{R1}{R1 + Rl}\right) * (+Vwrite - Vbe) + Vbe.$$

The program current (IPR) is the same as previously described irrespective of the parasitic transistors. The program current (IPR) is the same as the emitter current Ie and is given as $$Ie = \frac{Vwrite - Vbe}{R1 + Rl} = Ipr.$$

The collector current Ica through the bipolar transistor 50 is reduced as a part of the emitter current Ie flows through the first parasitic transistor 51. Thus, the collector current Ica is given by $$Ica = \left(\frac{\beta a}{\beta a + 1}\right)\left(\frac{Vwrite - Vbe}{R1 + Rl}\right).$$

The collector current Icp through the first parasitic transistor 51 is given by $$Icp = \left(\frac{\beta p}{\beta p + 1}\right)\left(\frac{Vwrite - Vbe}{R1 + Rl}\right).$$

In the above equations, $\beta a$ is the common emitter current gain of the bipolar transistor 50 while $\beta p$ is the common emitter gain of the first parasitic transistor 51.

As described previously, the maximum erase current through the second resistive element 20 is the collector current Ica flowing through the bipolar transistor 50 and is given by $$\frac{V2 + Vwrite}{R2} = Ica = \text{Max. Erase Current.}$$

The maximum erase current flowing through the second resistive switching element 20 is reduced because of the current flowing through the first parasitic transistor 51. Therefore, the maximum erase current may be written as $$Ipr * \left\{\left(\frac{\beta a}{\beta a + 1}\right) - \left(\frac{\beta p}{\beta p + 1}\right)\right\} = \text{Max. Erase Current.}$$

As a consequence, the operation of the memory cell is similar to that described above with respect to FIG. 3B although the current flowing through the second resistive switching element 20 is reduced because of the parasitic transistor. In both cases, the erase current through the second resistive switching element 20 is less than the program current through the first resistive switching element 10. Because of the parasitic effects, the erase current is further reduced. However, this reduction in erase current is controlled by $\beta p$, which in part is controlled by the base width of the parasitic transistor. Increasing the junction depth of 110 accomplishes this. Other methods, known to those with ordinary skill in the art, could also reduce the current gain of the parasitic transistor. The resulting maximum erase current should be sufficient to properly erase the memory cell.

FIG. 3D illustrates the operational states of the memory cell in accordance with embodiments of the present invention.

Referring to FIG. 3-D, the differential memory cell has a first state ("I") and a second state ("II"). The first state may be reached by programming the first resistive switching element 10 to a low resistance state (LO) while erasing the second resistive switching element 20 to a high resistance state (HI). As described above in various embodiments, this first state may be achieved by applying a positive write voltage $+V_{WRITE}$ on the other first bit line BL1 while applying a negative write voltage $-V_{WRITE}$ on the first bit line BL1#, and applying an intermediate voltage (e.g., 0V) on the first word line WL1.

For illustration, the high resistance state is assumed to have a resistivity of 100 kΩ and the low resistance state is assumed to have a resistivity of 10 kΩ.

Next, the second state may be programmed by applying a positive write voltage $+V_{WRITE}$ on the other first bit line BL1# while applying a negative write voltage $-V_{WRITE}$ on the first bit line BL1, and applying an intermediate voltage (e.g., 0V) on the first word line WL1.

In the second state, the first resistive switching element 10 has a high resistance state (HI) while the second resistive switching element 20 has a low resistance state (LO).

In a conventional memory cell, due to the design of the memory cell, the difference between the high resistance state and the low resistance state may be relatively small, which can result in read errors.

In contrast, in a differential memory cell described in various embodiments, the difference between the first state and a second state is magnified. Therefore, even if the high resistance state drifts to a lower resistance and/or if the low resistance state drifts to a higher resistance, the memory cell's functionality is not hindered.

Figure 3E:
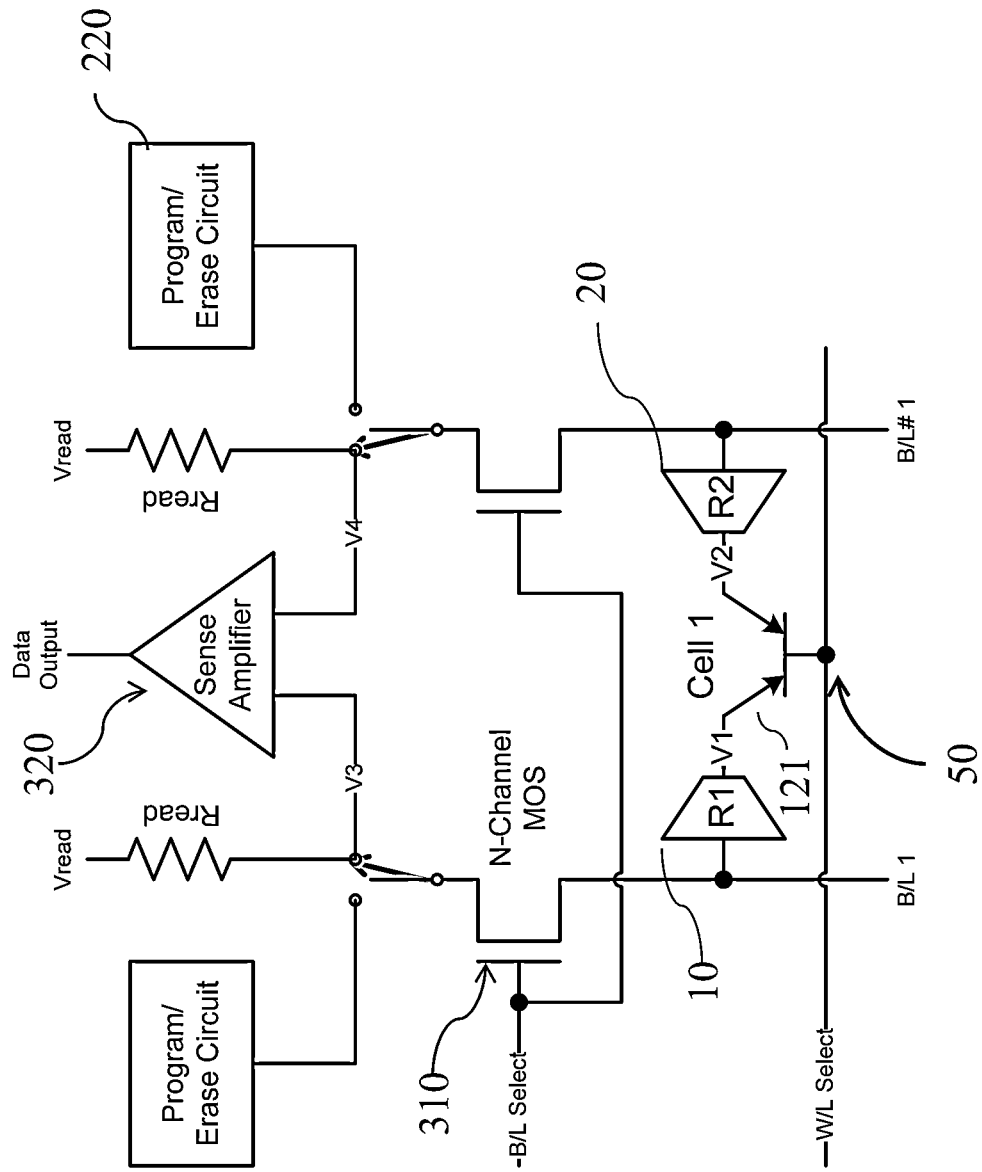

FIG. 3E illustrates a memory cell of the memory cell array during a read operation in accordance with an embodiment of the present invention.

In one or more embodiments, suitable read voltages may be applied for reading the memory state of the differential memory cell. In one embodiment, the different memory cell may be read by applying a same voltage, e.g., a positive read voltage +VREAD, at both the first bit line pairs BL1 and BL1# and applying a lower voltage (e.g., 0V or $-V_{READ}$) at the base region of the bipolar transistor 50. The difference in the currents flowing in the first bit line pairs BL1 and BL1# yields the memory state of the differential memory cell. As during programming, the fourth memory cell is inhibited by applying a positive read voltage $+V_{READ}$ on the remaining word lines (e.g., on the second word line WL2). Measuring the currents through the first bit line pairs BL1 and BL1# and the first word line WL1 provides the resistance of the first and the second resistive switching elements 10 and 20.

In one embodiment, a B/L select transistor 310 is activated by a select line. The device size of the B/L select transistor 310 is selected to obtain an acceptable ON resistance. The resistance Rread is selected in combination with the read voltage Vread for the difference between the voltages V3 and V4 (|V3−V4|) to achieve practical data sensing for the desired ranges of high resistance state (HI) and the low resistance state (LO).

As described above, the read voltage Vread is greater than Vbe, the voltage at the first emitter collector region 121 of the bipolar transistor 50. The third voltage V3 at the first input node of the sense amplifier 320 is given by the following equation.

$$V3 = (Vread - Vbe) * \frac{R1}{R1 + Rread}.$$

The fourth voltage V4 at the second input node of the sense amplifier 320 is given by the following equation.

$$V4 = (Vread - Vbe) * \frac{R2}{R2 + Rread}.$$

Here, Vbe may be about 0.5V for the low resistance state (LO) and about 0V for the high resistance state (HI).

FIG. 4, which includes FIGS. 4A-4E, illustrates a memory cell array in accordance with an alternative embodiment of the present invention.

Unlike the prior embodiment, in this embodiment, the bipolar transistor is a NPN transistor 55. Consequently, the first resistive switching device 10 and the second resistive switching device 20 have to be interchanged (in other words reversed in polarity).

Figure 4A:
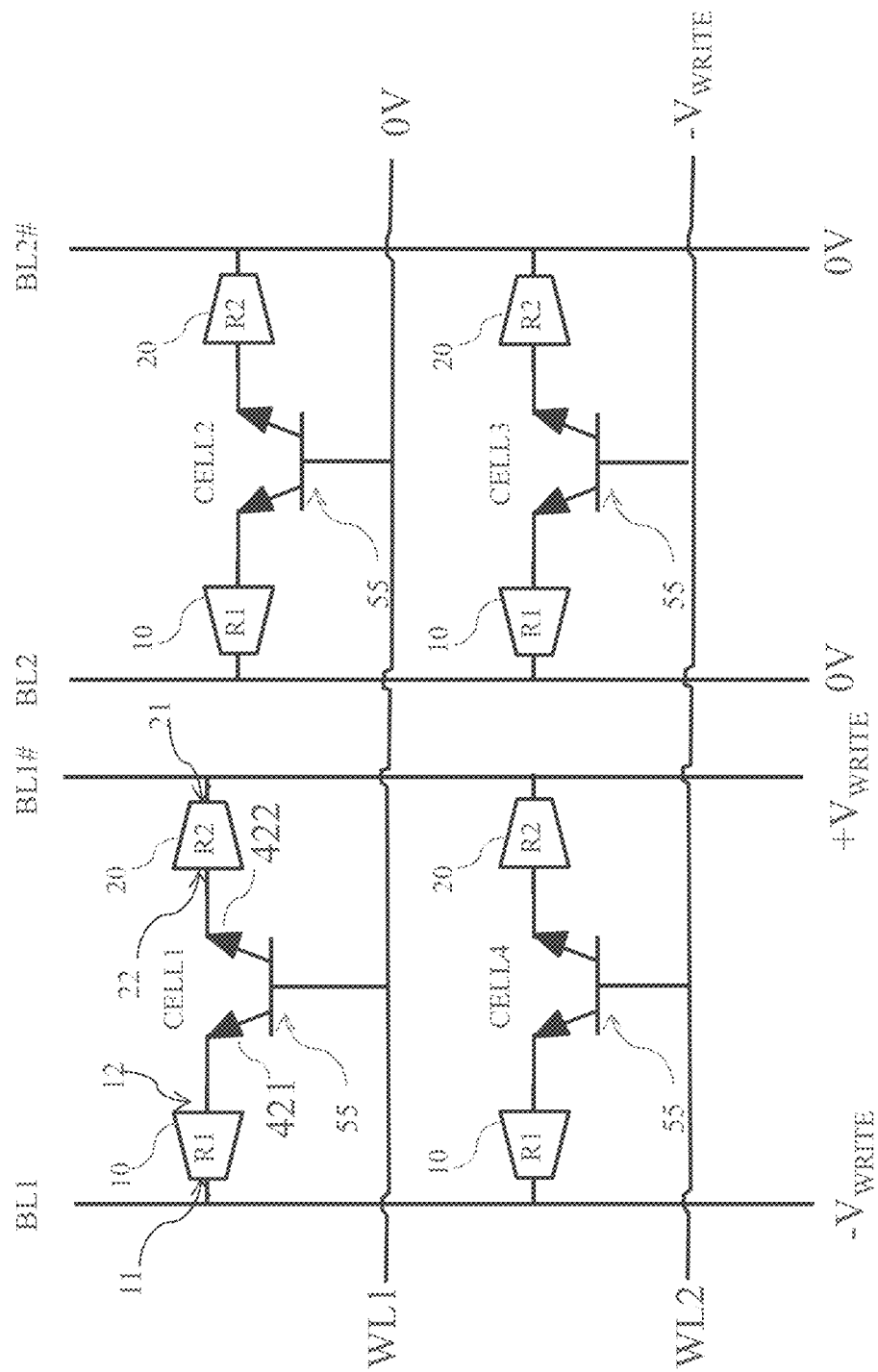

Referring to FIG. 4A, the NPN transistor 55 includes a first collector/emitter region 421, a second collector/emitter region 422 and a base region. As illustrated, the cathode 11 of the first resistive switching element 10 is coupled to a first bit line BL1 while the cathode 21 of the second resistive switching element 10 is coupled to the other first bit line BL1#. Similarly, the anode 12 of the first resistive switching element 10 is coupled to a first collector/emitter region 421 while the anode 22 of the second resistive switching element 20 is coupled to a second collector/emitter region 422. The base of the NPN transistor 55 is coupled to a first word line WL1.

The memory cell may be programmed to a first state (LO on the first resistive switching element 10 and HI on the second resistive switching element 20) by applying a negative write voltage $-V_{WRITE}$ at a first bit line BL1 and a positive write voltage $V_{WRITE}$ at the other first bit line BL1#, and an intermediate voltage at the first word line WL1. Similarly, the memory cell may be programmed to a second state by reversing the voltage between the first bit line pairs. The fourth memory cell (and other memory cells in the column of the first bit line pairs) may be inhibited by applying a negative write voltage $-V_{WRITE}$ on the remaining word lines such as the first word line WL1.

Figure 4B:
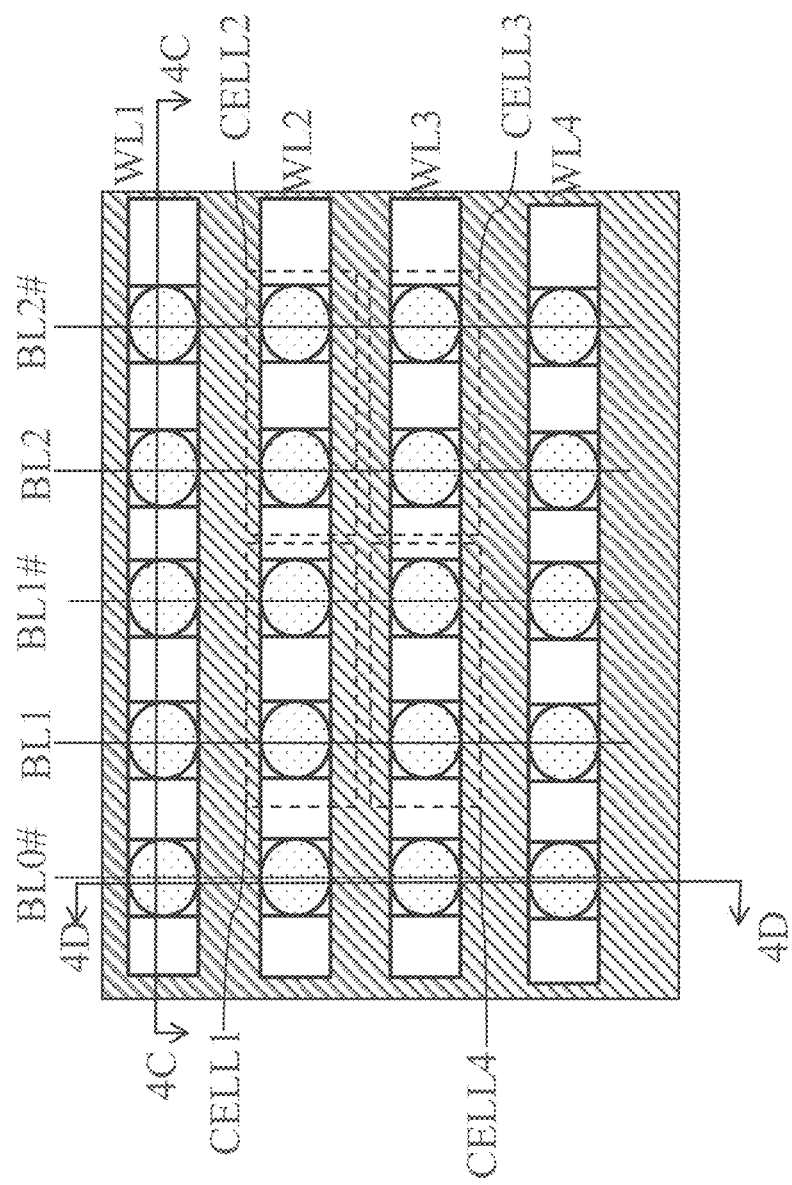
Figure 4C:
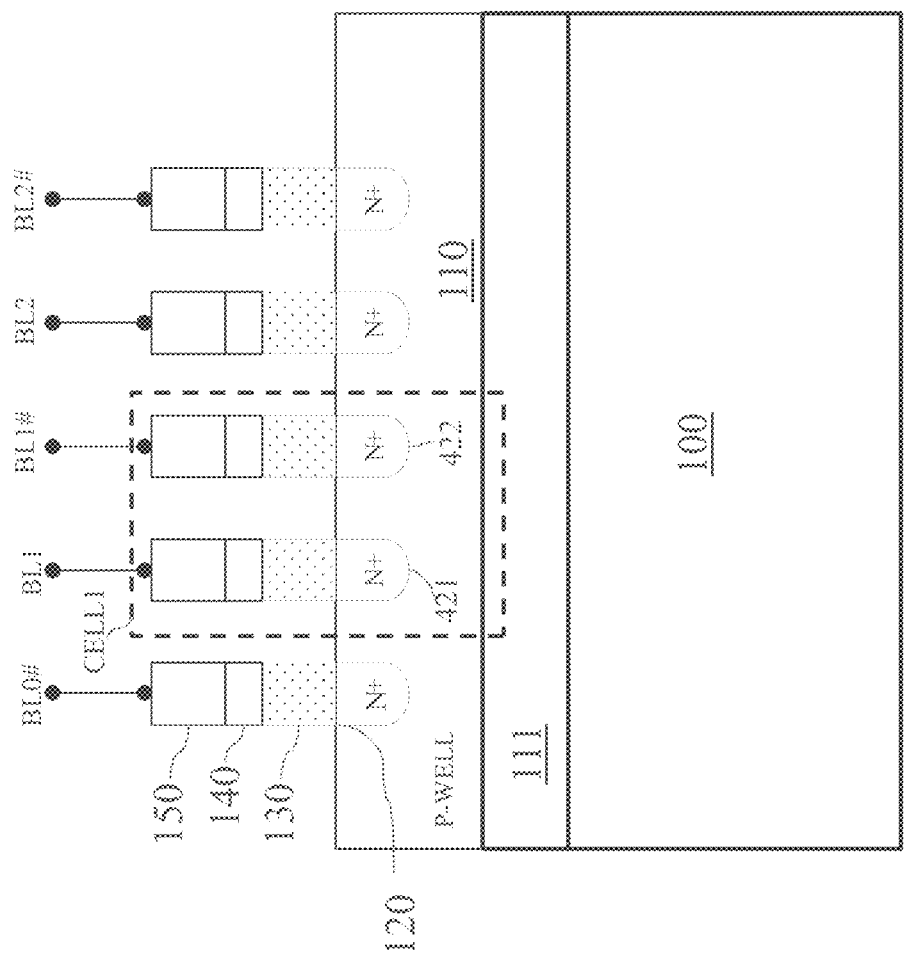
Figure 4D:
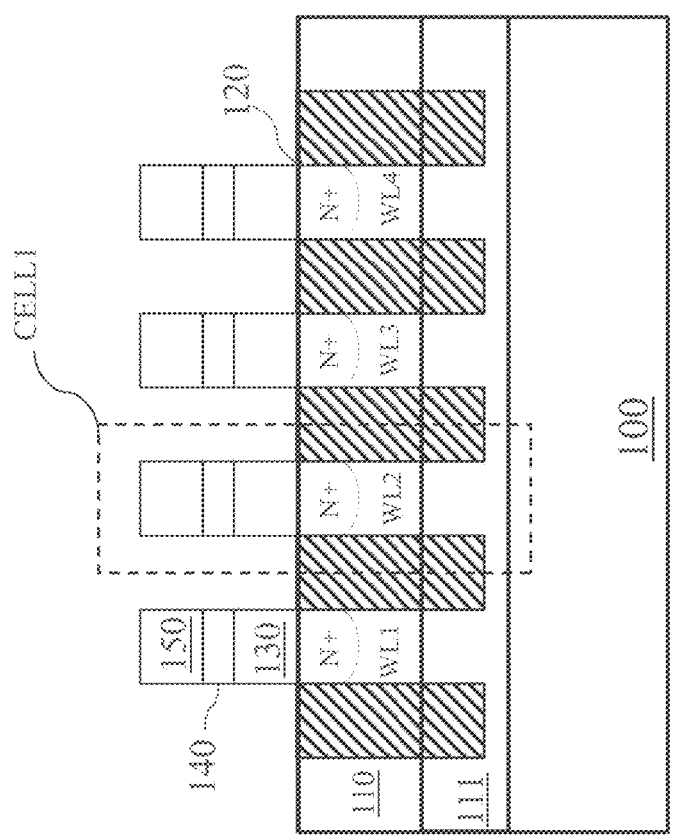
Figure 4E:
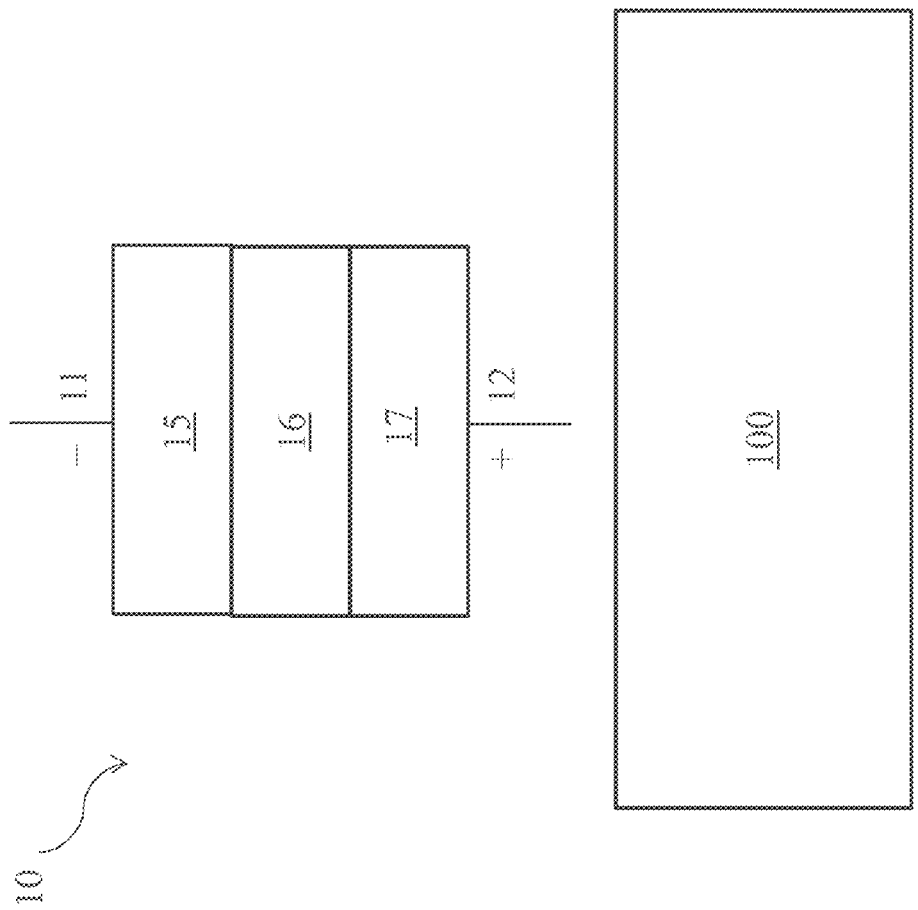

FIGS. 4B-4E illustrate a structural implementation of the memory cell illustrated in FIG. 4A in accordance with embodiments of the present invention. FIG. 4B illustrates a top view, FIGS. 4C and 4D illustrate cross-sectional views while FIG. 4E illustrates a magnified cross-sectional view of the resistive switching element.

Referring to FIG. 4C, a well region 110 comprising plurality of word lines and having a p-type doping are formed as described in prior embodiments. In this embodiment, the substrate 100 may have an n-type doping in one embodiment.

Alternatively, the well region 110 comprising the plurality of word lines may be formed within a double well structure. In other words, an n-type well region 111 may be formed over a substrate 100, which may have a p-type doping and subsequently the well region 110 comprising the plurality of word lines may be formed within the n-type well region 111.

The plurality of doped regions 120 are formed over the well region 110 comprising the plurality of word lines. The plurality of doped regions 120 includes the first collector/emitter region 421 and the second collector/emitter region 422.

As in the prior embodiment, a plurality of contacts 130 couple the plurality of doped regions 120 to the resistive switching layer. As in prior embodiments, a plurality of resistive switching elements 140 is formed over the plurality of contacts 130 and a plurality of bit line contacts 150 are formed over the plurality of resistive switching elements 140. However, unlike the prior embodiments, the layers of the plurality of resistive switching elements 140 are reversed in this embodiment.

FIG. 4E illustrates an element such as the first resistive switching element 10 of the plurality of resistive switching elements 140 in accordance with an embodiment of the invention. As illustrated, the location of the cathode electrode layer 15 and the anode electrode layer 17 are exchanged such that the anode electrode layer 17 is formed as a bottom electrode and the cathode electrode layer 15 is formed as a top electrode.

Figure 5:
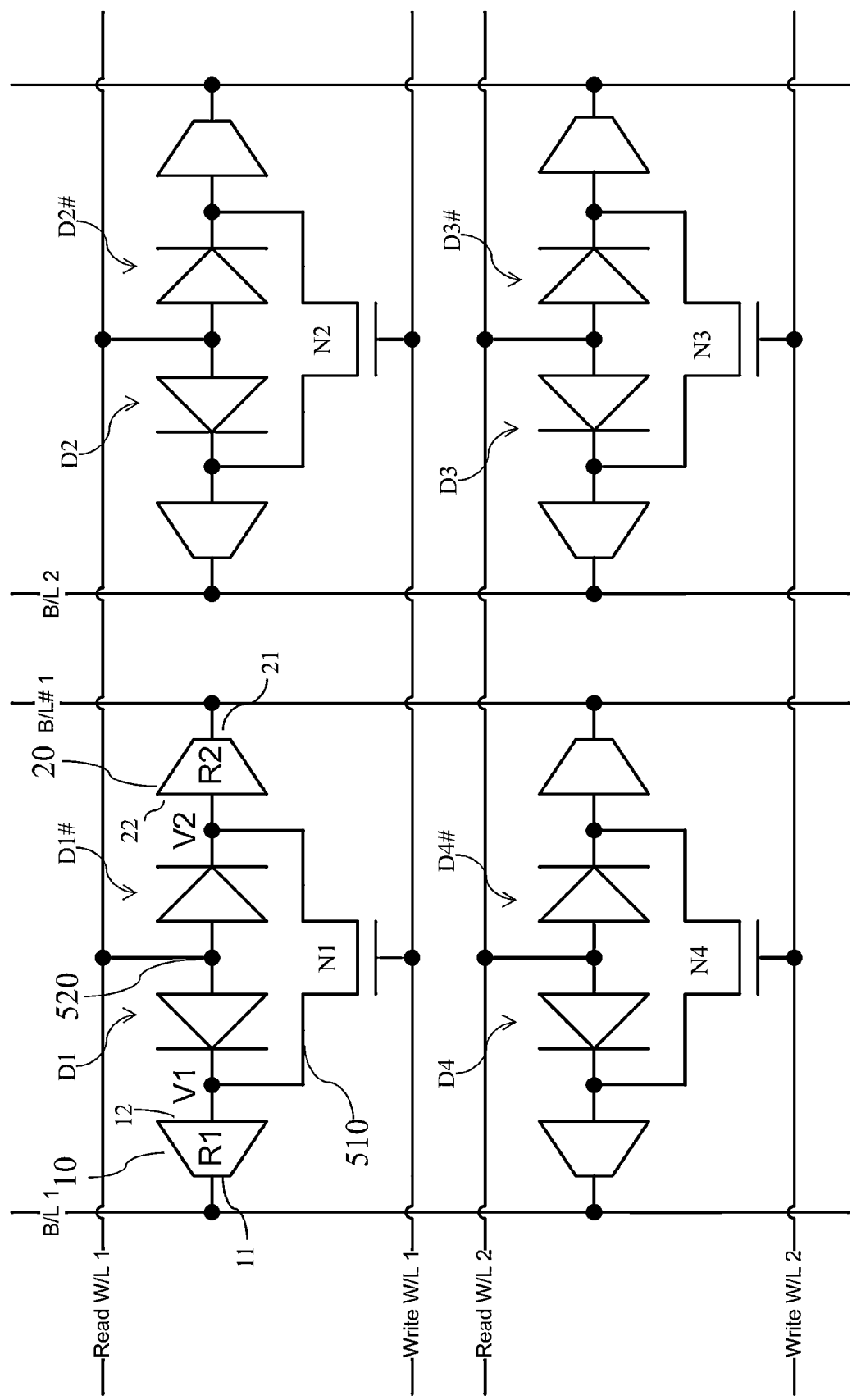
FIG. 5 illustrates a further embodiment of the differential memory cell array having a NFET and having blocking diodes in accordance with an embodiment of the present invention.

FIG. 5 illustrates a memory cell array having a NFET and blocking diodes in accordance with an alternative embodiment of the present invention.

Unlike the prior embodiments, in this embodiment, a field effect transistor is used instead of the bipolar transistor. Referring to FIG. 5, a field effect transistor 500 (such as the first NFET N1) is coupled between the anode 12 of the first resistive switching element 10 and anode 22 of the second resistive switching element 20.

A first source/drain region of the field effect transistor 500 is coupled to the anode 12 of the first resistive switching element 10 and a second source range region of the field effect transistor 500 is coupled to the anode 22 of the second resistive switching element 20. The gate of the field effect transistor 500 is coupled to a write word line such as the first write word line WL1.

During transitioning from one state to another state, the field effect transistor 500 is operated in inversion such that a source to drain current flows through the field effect transistor 500. In the absence of a gate bias on the field effect transistor 500, the field effect transistor 500 cuts offs the program/erase/read operation although a leakage current may pass through the field effect transistor 500.

The field effect transistor 500 may be an n-channel field effect transistor (NFET) or a p-channel field effect transistor (PFET) as will be described in FIG. 6.

As described above in prior embodiments, the first resistive switching element 10 may be switched from a high resistance state to a low resistance state while simultaneously the current flowing through the field effect transistor 500 is used to switch the second resistive switching element 20 from a low resistance state to a high resistance state and vice versa.

As further illustrated, each memory cell has a first diode D1 and another first diode D1# coupled between the anode 12 of the first resistive switching element 10 and the anode 22 of the second resistive switching element 20. Similarly, the second memory cell has the second diode pair D2 and D2#, the third memory cell has the third diode pair D3 and D3#, and the fourth memory cell has the fourth diode pair D4 and D4#.

In this illustrated embodiment, the field effect transistor is a NFET, and therefore each memory cell has an associated NFET (N1, N2, N3, and N4).

As illustrated, the anode 12 of the first resistive switching element 10 is coupled to the n-side of the first diode D1 (i.e., cathode of the diode) and the anode 22 of the second resistive switching element 20 is also coupled to the n-side of the other first diode D1#. Thus, the interconnect 510 between the cathode of the first diode D1 and the first source/drain region of the NFET N1 as well as between the cathode of the other first diode D1# and the second source/drain region of the NFET N1 may be formed through the semiconductor region of the substrate. Similarly, the connection between the p-side of the first diode D1 and the p-side of the other first diode D1# may be through a semiconductor region, i.e., the p-side of the first diode D1 and D1# may share a common p-type region.

Figure 6:
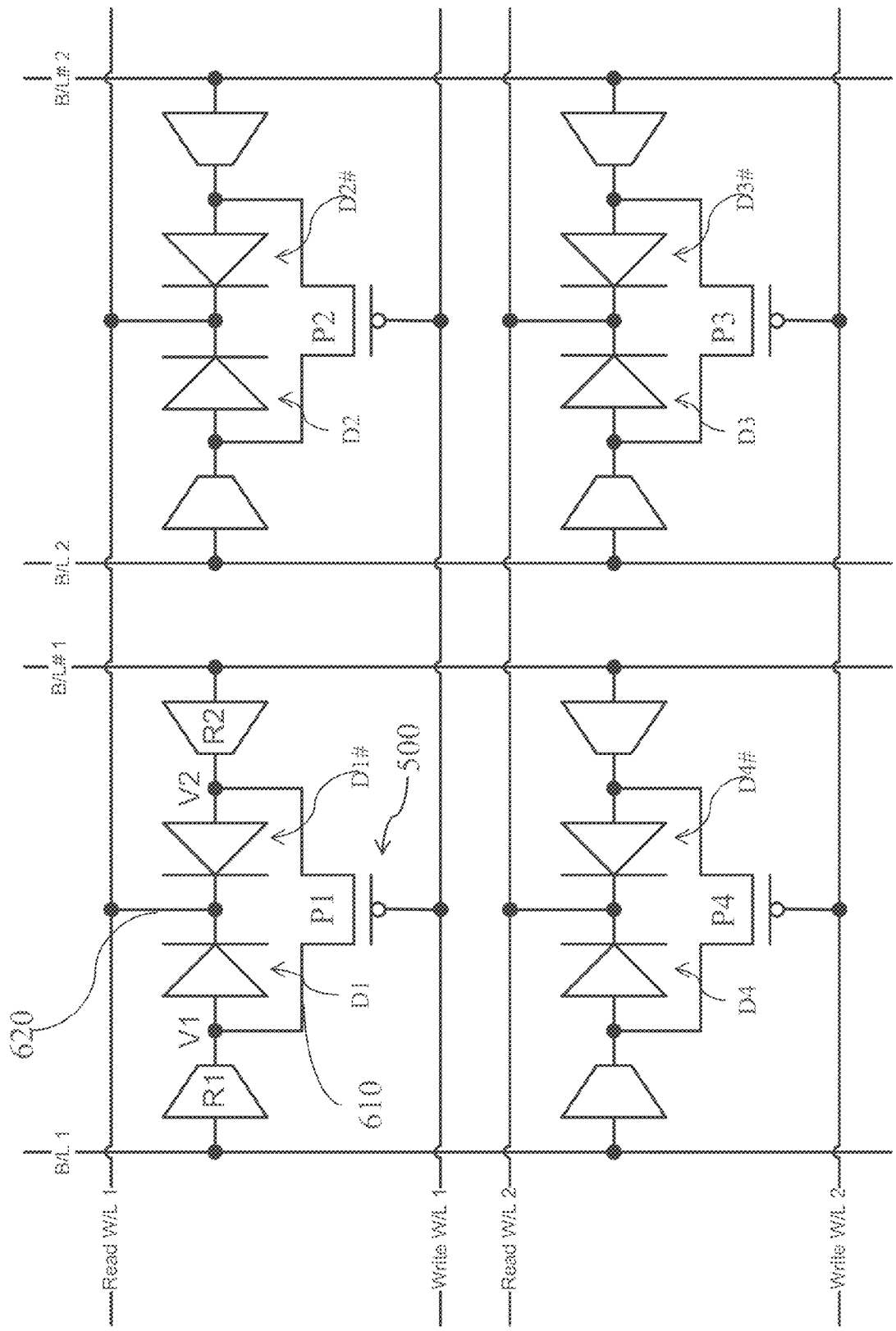
FIG. 6 illustrates a further embodiment of the differential memory cell array having a PFET and blocking diodes in accordance with an embodiment of the present invention.

FIG. 6 illustrates a further embodiment of the differential memory cell array having a PFET and blocking diodes in accordance with an embodiment of the present invention.

Unlike the embodiment illustrated in FIG. 5, in this embodiment a PFET is used instead of a NFET. Therefore each memory cell has an associated PFET (P1, P2, P3, and P4).

Similarly, the source/drain regions of the PFET are of the same type of doping as the p-side of the diodes D1 and D1#. Therefore, the connection between the anode of the first diode D1 to the first source/drain region of the PFET P1 and the connection between the anode of the other first diode D1# to the second source/drain region of the PFET P1 may be made within the semiconductor substrate.

Figure 7A:
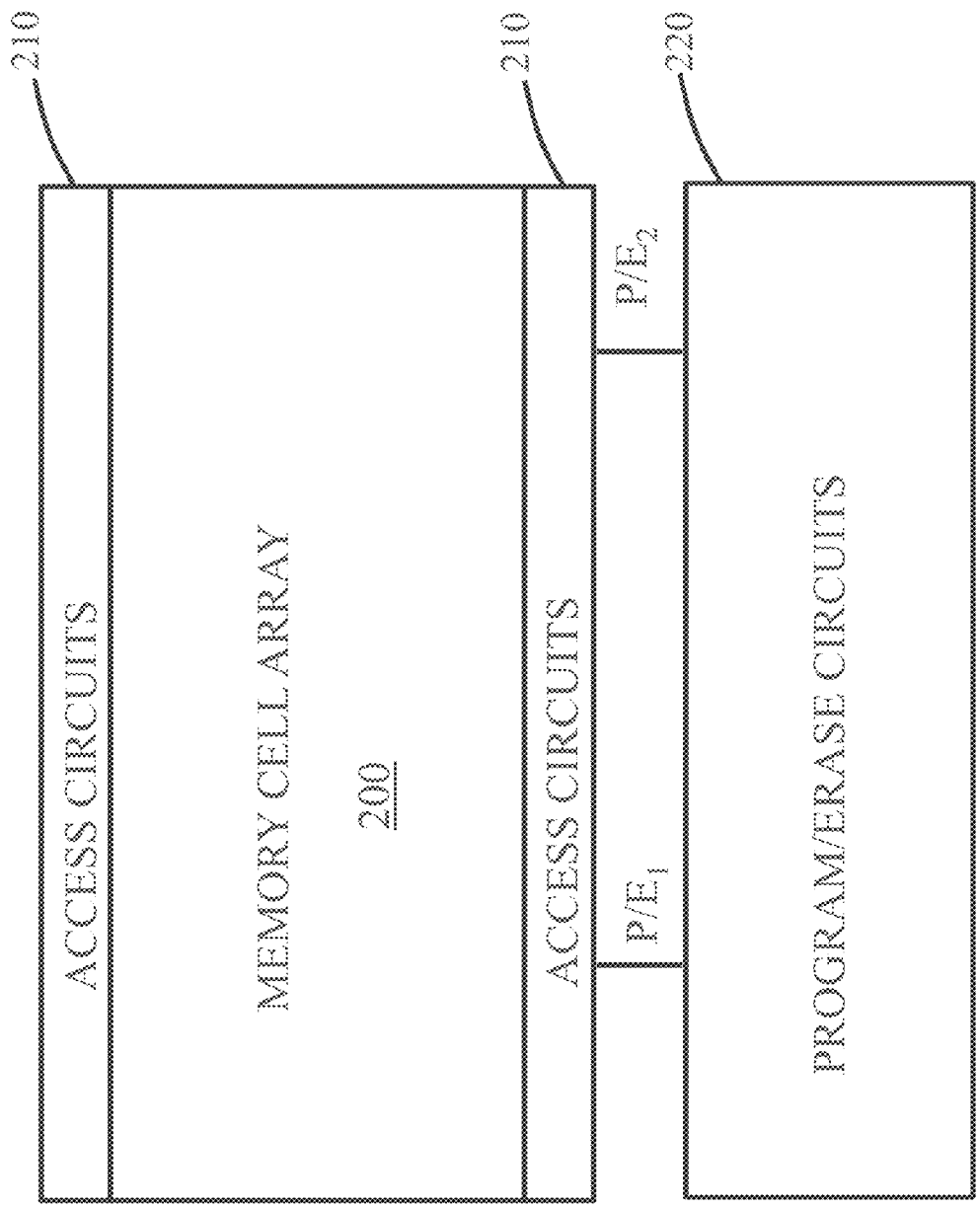
FIGS. 7A-7C, illustrates a memory device implementing embodiments of the invention.
Figure 7B:
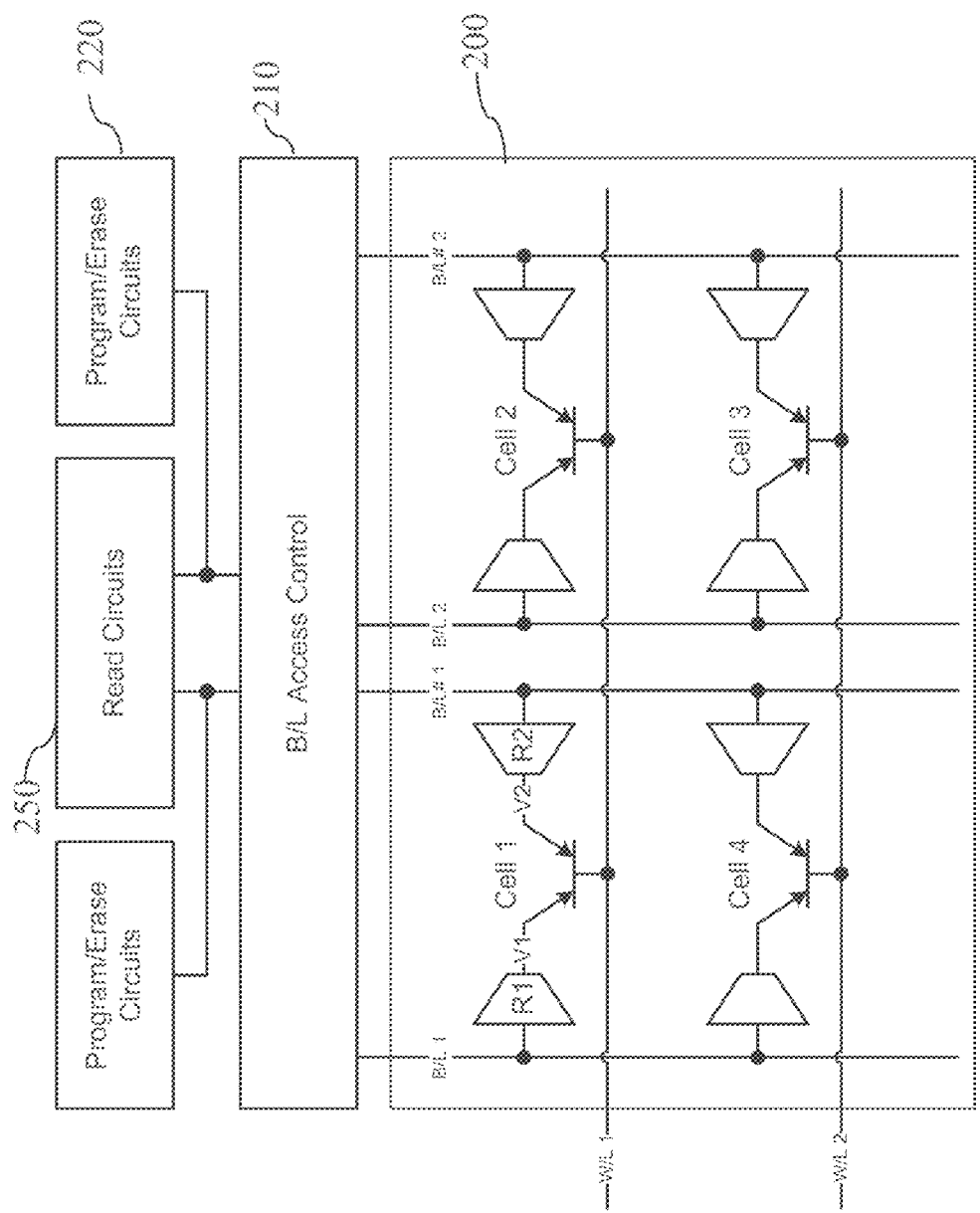
Figure 7C:
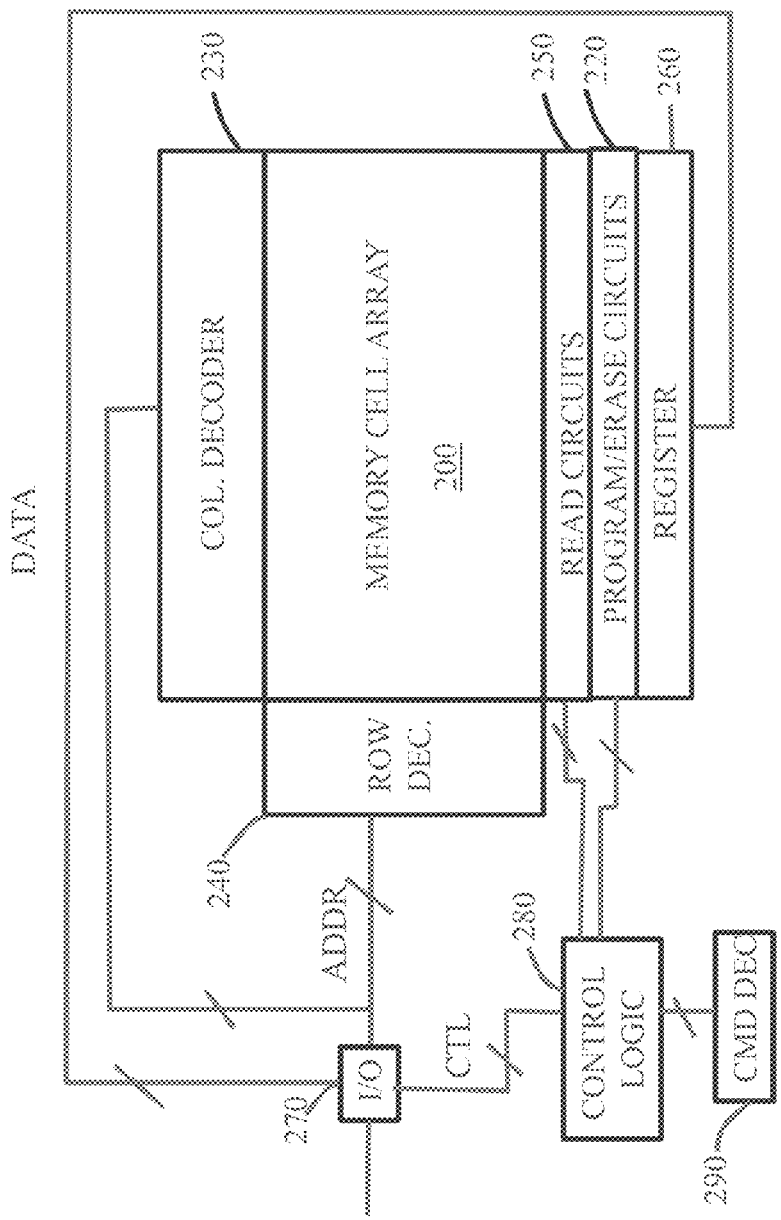

FIG. 7, which includes FIGS. 7A-7C, illustrates a memory device implementing embodiments of the invention.

Referring to FIG. 7A, the memory device comprises a memory cell array 200 (e.g., as described in various embodiments previously), access circuits 210, and program/erase circuits 220. The memory cell array 200 may comprise a plurality of memory cells (CELL1, CELL2, CELL3, CELL4) as described previously in FIGS. 1-6. The access circuits 210 provide electrical connections to the memory cell array 200 so that the memory cells may be programmed, erased, and read. The access circuits 210 may be located on one or more sides of the memory cell array 200. For example, the access circuits 210 may be located on opposite sides such that the potential may be applied across the memory units. The access circuits 210 may comprise word line drivers, bit line drivers as an example.

The program and erase circuits 220 may provide program and erase signals (e.g., $P/E_1$, $P/E_2$) to the access circuits 210, which applies them to the memory cell array 200. The peak program or erase voltage may be higher than or lower than a supply voltage. The program and erase circuits may include charge pump circuits for generating higher than supply voltages, or step down voltage regulators and the like generating lower than supply voltages. The program and erase circuits may also receive one or more of the program and erase signals from an external circuit in some embodiments. In some embodiments, the program and erase circuits may comprise program circuits physically separate from the erase circuits.

Referring to FIG. 7B, the program and erase circuits 220 and the read circuits 250 may be connected such that one of them may be asserted through the access circuits 210, which may access control to the bit lines.

FIG. 7C illustrates a further embodiment of the memory device. The memory device includes the program and erase circuits 220 and memory cell array 200 as described in FIG. 7A and FIG. 7B. The access circuits may include a column decoder 230 and a row decoder 240. In response to an address data, the column and the row decoders 230 and 240 may select a group of memory cells for reading, programming, erasing. Further, the memory device may comprise read circuits 250 separate from the program and erase circuits 220. The read circuits 250 may include current and/or voltage sense amplifiers. The memory device may further include a register 260 for storing read data values from the memory cell array 200 or to store data to be written into the memory cell array 200. In various embodiments, the register 260 may input and output data in parallel (i.e., bytes, words, and others). In some embodiments, the register 260 may be accessed by serial data paths.

Input/output (I/O) circuits 270 may receive address values and write data values, and output read data values. The received address values may be applied to column and row decoders 230 and 240 to select memory cells. Read data from the register 260 may be output over the I/O circuits 270. Similarly, write data on I/O circuits 270 may be stored in registers 260. A command decoder 290 may receive command data, which may be passed on to the control logic 280. The control logic 280 may provide signals to control various circuits of the memory device.

Figure 8:
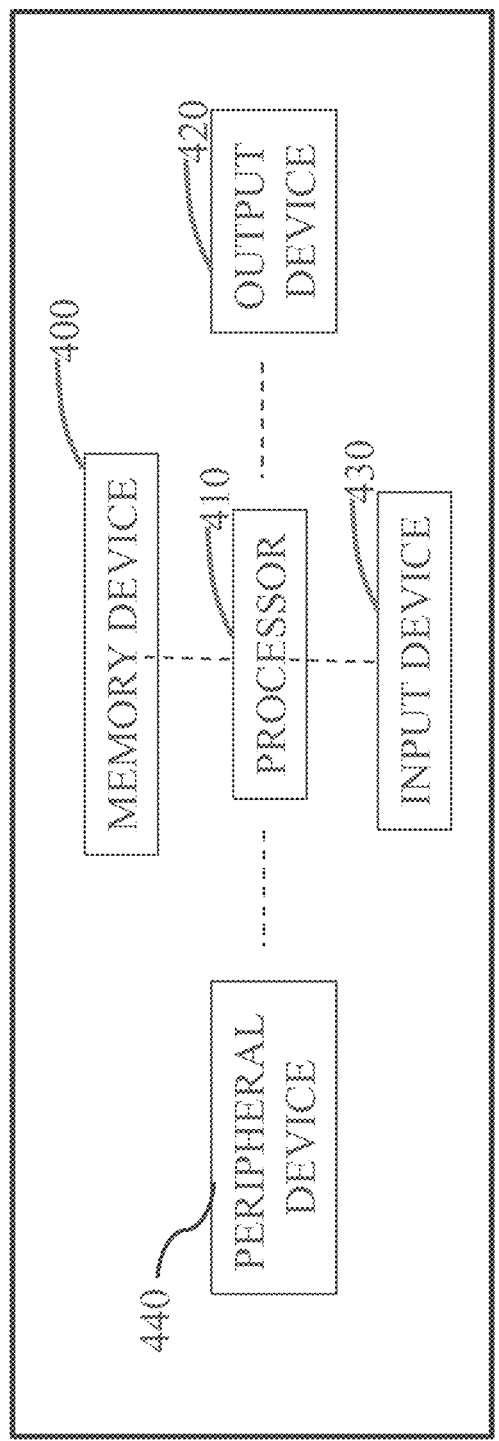
FIG. 8 illustrates a schematic block diagram of a system implementing embodiments of the invention.

FIG. 8 illustrates a schematic block diagram of a system implementing embodiments of the invention.

As illustrated in FIG. 8, the system may comprise the memory device 400, a processor 410, and output device 420, an input device 430, and optionally a peripheral device 450. The memory device 400 may be formed as described in FIG. 7 in one or more embodiments and may comprise a plurality of memory units.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-6 may be combined each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory cell comprising:
    a first resistive switching element comprising a first high resistance state and a first low resistance state and having a first terminal and a second terminal;
    a second resistive switching element comprising a second high resistance state and a second low resistance state and having a first terminal and a second terminal; and
    a transistor including a first terminal, a second terminal, and a third terminal, the first terminal of the transistor coupled to the first terminal of the first resistive switching element, the second terminal of the transistor coupled to the first terminal of the second resistive switching element, the third terminal of the transistor coupled to a word line, wherein the first terminals of the first and the second resistive elements are anode or cathode terminals, wherein the second terminals of the first and the second resistive elements are cathode or anode terminals, wherein the first and the second terminals of the transistor are both coupled to anode terminals of the first and the second resistive switching elements or to cathode terminals of the first and the second resistive switching elements.

2. The memory cell of claim 1, wherein the transistor is configured to shunt the first terminal of the first resistive switching element with the first terminal of the second resistive switching element so as to program the first resistive switching element and erase the second resistive switching element simultaneously.

3. The memory cell of claim 1, wherein the second terminal of the first resistive switching element is coupled to a first bit line, wherein the second terminal of the second resistive switching element is coupled to a second bit line.

4. The memory cell of claim 1, wherein the first resistive switching element is configured to have a resistance state opposite to the second resistive switching element.

5. The memory cell of claim 1, wherein the transistor is a bipolar transistor.

6. The memory cell of claim 5, wherein the first terminal of the transistor is a first emitter/collector, wherein the second terminal of the transistor is a second emitter/collector, and wherein the third terminal of the transistor is a base.

7. A memory cell comprising:
    a first resistive switching element having a first terminal and a second terminal;
    a second resistive switching element having a first terminal and a second terminal; and
    a three terminal transistor having a first terminal, a second terminal, and a third terminal, the first terminal of the three terminal transistor coupled to the first terminal of the first resistive switching element, the second terminal of the three terminal transistor coupled to the first terminal of the second resistive switching element, the third terminal of the three terminal transistor coupled to a word line, wherein the transistor is a PNP transistor, wherein the first terminal of the first resistive switching element is a cathode terminal of the first resistive switching element, and wherein the first terminal of the second resistive switching element is a cathode terminal of the second resistive switching element.

8. The memory cell of claim 5, wherein the bipolar transistor is a NPN transistor, wherein the first terminal of the first resistive switching element is an anode terminal of the first resistive switching element, and wherein the first terminal of the second resistive switching element is a anode terminal of the second resistive switching element.

9. A memory cell comprising:
    a first resistive switching element having a cathode terminal and an anode terminal;
    a second resistive switching element having a cathode terminal and an anode terminal; and
    a bipolar transistor having a first emitter/collector, a second emitter/collector, and a base, the first emitter/collector coupled to the cathode terminal of the first resistive switching element, the second emitter/collector coupled to the cathode terminal of the second resistive switching element, the base coupled to a word line, the anode terminal of the first resistive switching element coupled to a first bit line of a bit line pair, the anode terminal of the second resistive switching element coupled to a second bit line of the bit line pair, the memory cell configured to store a first or a second memory state.

10. The memory cell of claim 9, wherein the bipolar transistor is a PNP transistor.

11. The memory cell of claim 9, wherein the bipolar transistor is a NPN transistor.

12. The memory cell of claim 9, wherein the first resistive switching element is configured to have a resistance state opposite to the second resistive switching element.

13. The memory cell of claim1, wherein the transistor comprises a bipolar transistor or a field effect transistor, and wherein both the first and the second terminals of the transistor comprise a source/drain terminal or a emitter/collector terminal.

14. The memory cell of claim 1, wherein the first and the second terminals of the transistor are both coupled to anode terminals of the first and the second resistive switching elements.

15. The memory cell of claim 1, wherein the transistor is a three terminal device.

16. The memory cell of claim 1, wherein the first resistive switching element and the second resistive switching element are configured to be in opposite resistive states.

17. The memory cell of claim 1, wherein the memory cell has a first memory state when the first resistive switching element has the first high resistance state and the second resistive switching element has the second low resistance state, wherein the memory cell has a second memory state when the first resistive switching element has the first low resistance state and the second resistive switching element has the second high resistance state.

18. The memory cell of claim 1,
    wherein the transistor comprise:
        a first doped region comprising a first doping type disposed in a well region having an opposite second doping type; and
        a second doping region comprising the first doping type disposed in the well region, the second doped region being separated from the first doped region by a portion of the well region, wherein the first doped region, the second doped region, and the portion of the well region form part of the transistor, wherein the first resistive switching element is disposed over and coupled to the first doped region, wherein the second resistive switching element is disposed over and coupled to the second doped region, and wherein the word line is disposed in the well region.

19. A method of operating a memory cell, the method comprising:
providing a memory cell comprising:
a first resistive switching element comprising a first high resistance state and a first low resistance state and having a first terminal and a second terminal;
a second resistive switching element comprising a second high resistance state and a second low resistance state and having a first terminal and a second terminal; and
a transistor including a first terminal, a second terminal, and a third terminal, the first terminal of the transistor coupled to the first terminal of the first resistive switching element, the second terminal of the transistor coupled to the first terminal of the second resistive switching element, the third terminal of the transistor coupled to a word line, wherein the first terminals of the first and the second resistive elements are anode or cathode terminals, wherein the second terminals of the first and the second resistive elements are cathode or anode terminals, wherein the first and the second terminals of the transistor are both coupled to anode terminals of the first and the second resistive switching elements or to cathode terminals of the first and the second resistive switching elements, wherein the second terminal of the first resistive switching element is coupled to a first bit line, and wherein the second terminal of the second resistive switching element is coupled to a second bit line;
applying a positive write voltage at the first bit line and a negative write voltage at the second bit line; and
activating the word line to an intermediate voltage between the positive write voltage and the negative write voltage so as to program the first resistive switching element and erase the second resistive switching element simultaneously.

20. The method of claim 19, wherein the transistor comprises a bipolar transistor or a field effect transistor, and wherein both the first and the second terminals of the transistor comprise a source/drain terminal or a emitter/collector terminal.

21. The method of claim 19, wherein the first and the second terminals of the transistor are both coupled to anode terminals of the first and the second resistive switching elements.

22. The method of claim 19, wherein, during a read operation, no current flows from the first bit line to the second bit line.

23. The method of claim 22, wherein the read operation comprises:

applying a read voltage at the first bit line and the second bit line, and
applying an intermediate voltage at the at the word line, wherein a memory state of the memory cell is identified by the difference in the current in the first bit line to the current in the second bit line.

24. A memory cell comprising:
a well region having a first doping type disposed in a semiconductor substrate;
isolation regions disposed in the semiconductor substrate and dividing the well region into a plurality of word lines;
a first doped region comprising an opposite second doping type disposed in a word line of the plurality of word lines;
a second doped region comprising the second doping type disposed in the word line, the second doped region being separated from the first doped region by a portion of the well region, wherein the first doped region, the second doped region, and the portion of the well region form part of a lateral bipolar transistor;
a first resistive switching element having a first high resistance state and a first low resistance state and comprising a anode/cathode terminal and a corresponding cathode/anode terminal, wherein the anode/cathode terminal of the first resistive switching element is disposed over and coupled to the first doped region; and
a second resistive switching element having a second high resistance state and a second low resistance state and comprising a anode/cathode terminal and a corresponding cathode/anode terminal, wherein the anode/cathode terminal of the second resistive switching element is disposed over and coupled to the second doped region.

25. The memory cell of claim 24, further comprising:
a first bit line disposed over the first resistive switching element, the first bit line coupled to the cathode/anode terminal of the first resistive switching element; and
a second bit line disposed over the second resistive switching element, the second bit line coupled to the cathode/anode terminal of the second resistive switching element.

26. The memory cell of claim 24, wherein the anode/cathode terminal of the first and the second resistive switching elements are anode terminals so that the first and the second doped region of the transistor are both coupled to anode terminals of the first and the second resistive switching elements.

27. The memory cell of claim 24, wherein the anode/cathode terminal of the first and the second resistive switching elements are cathode terminals so that the first and the second doped regions of the transistor are both coupled to cathode terminals of the first and the second resistive switching elements.

* * * * *